(12) United States Patent
Abe et al.

(10) Patent No.: US 11,543,614 B2
(45) Date of Patent: Jan. 3, 2023

(54) IMAGING APPARATUS, MOBILE OBJECT, AND MANUFACTURING METHOD

(71) Applicant: KYOCERA Corporation, Kyoto (JP)

(72) Inventors: Hiroyuki Abe, Kawasaki (JP); Takahiro Okada, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 337 days.

(21) Appl. No.: 16/643,478

(22) PCT Filed: Aug. 15, 2018

(86) PCT No.: PCT/JP2018/030369
§ 371 (c)(1),
(2) Date: Feb. 28, 2020

(87) PCT Pub. No.: WO2019/044509
PCT Pub. Date: Mar. 7, 2019

(65) Prior Publication Data
US 2020/0363601 A1    Nov. 19, 2020

(30) Foreign Application Priority Data

Aug. 29, 2017 (JP) .............................. JP2017-164858
Aug. 29, 2017 (JP) .............................. JP2017-164859

(51) Int. Cl.
*G02B 7/00* (2021.01)
*G02B 7/02* (2021.01)
*H04N 5/225* (2006.01)

(52) U.S. Cl.
CPC .............. *G02B 7/003* (2013.01); *G02B 7/02* (2013.01); *H04N 5/2254* (2013.01)

(58) Field of Classification Search
CPC ...... G02B 13/0015; G02B 7/003; G02B 7/02; G02B 7/021; G02B 7/025; G02B 9/04;
(Continued)

(56) References Cited

U.S. PATENT DOCUMENTS 9,407,802 B2    8/2016  Nakamura et al.
2004/0047050 A1*  3/2004  Bauer .................. H04N 5/2254
                                                257/E31.118
(Continued)

FOREIGN PATENT DOCUMENTS

CN    204731515 U    10/2015
JP    2010219713 A    9/2010
JP    2016027360 A    2/2016

*Primary Examiner* — Amy R Hsu
(74) *Attorney, Agent, or Firm* — Studebaker & Brackett PC

(57) ABSTRACT

Misalignment of a substrate portion which integrates an image sensor and a substrate is suppressed. An imaging apparatus comprises: an imaging optical system including at least one optical element; a holding member holding the imaging optical system; an image sensor configured to capture a subject image formed by the imaging optical system; a substrate having the image sensor mounted thereon; and a bonding member fixing a substrate portion to the holding member, the substrate portion integrating the image sensor and the substrate, wherein the bonding member is partly in contact with a surface of the substrate portion, and at at least two positions in a part of the surface of the substrate portion in contact with the bonding member, the surface of the substrate portion faces different directions.

16 Claims, 31 Drawing Sheets

(58) Field of Classification Search
CPC ........ G03B 2217/002; H01L 27/14618; H01L 27/14625; H04N 5/2253; H04N 5/2254
See application file for complete search history.

(56) References Cited

U.S. PATENT DOCUMENTS

| | | | |
|---|---|---|---|
| 2007/0263116 A1 | 11/2007 | Sakurai | |
| 2008/0297645 A1* | 12/2008 | Lo | G02B 7/02 438/69 |
| 2012/0175508 A1* | 7/2012 | Kashima | G02B 7/02 250/239 |
| 2016/0028929 A1* | 1/2016 | Nakamura | H04N 5/2253 348/373 |
| 2016/0254397 A1* | 9/2016 | Senn | H02S 40/44 257/98 |
| 2017/0307842 A1* | 10/2017 | Nakamura | H01L 27/14618 |
| 2018/0006070 A1* | 1/2018 | Isobe | H01L 27/14607 |

\* cited by examiner

FIG. 2
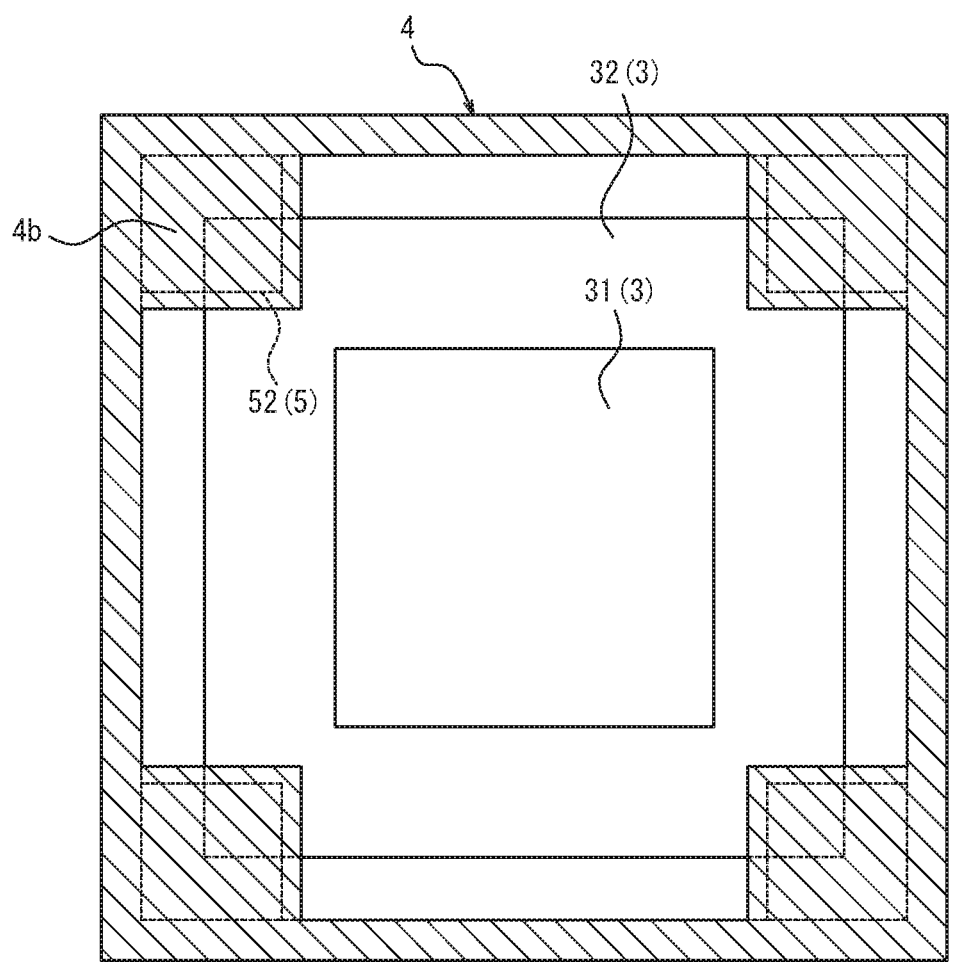
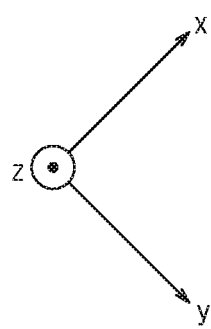

FIG. 17
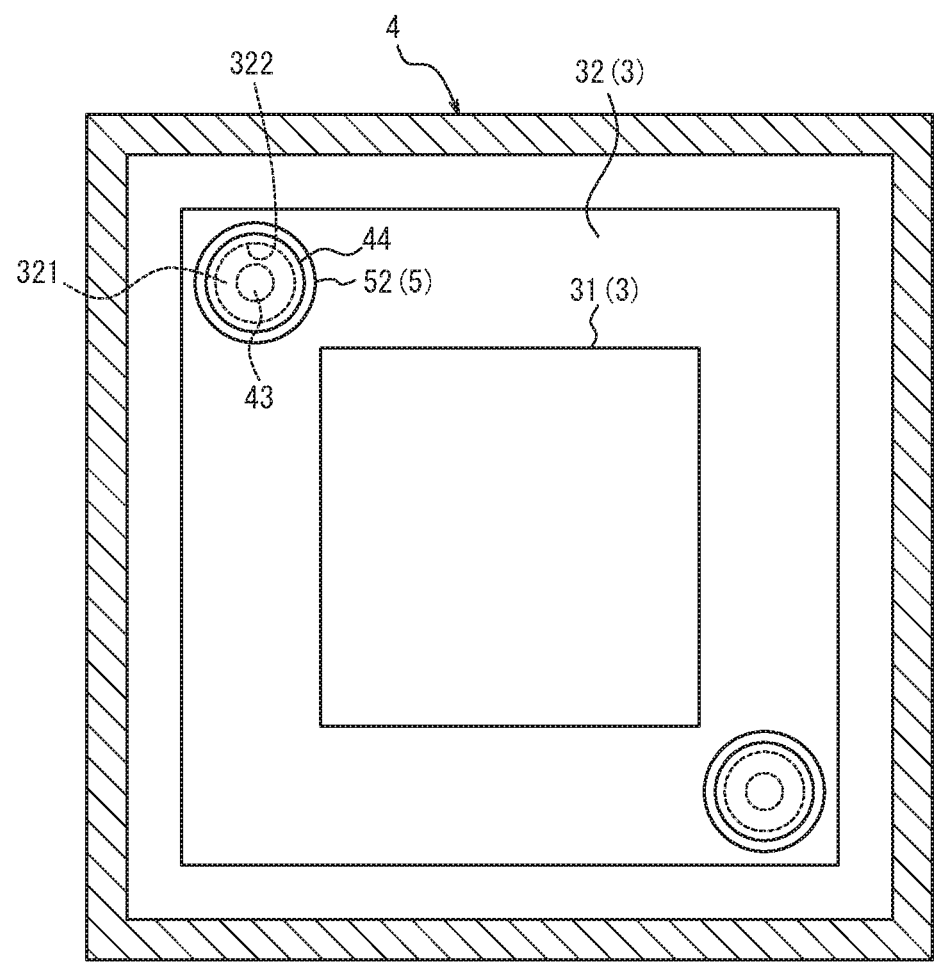
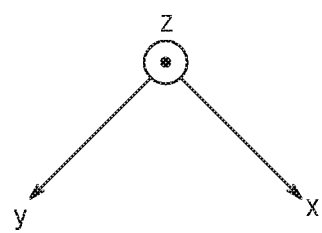

FIG. 19
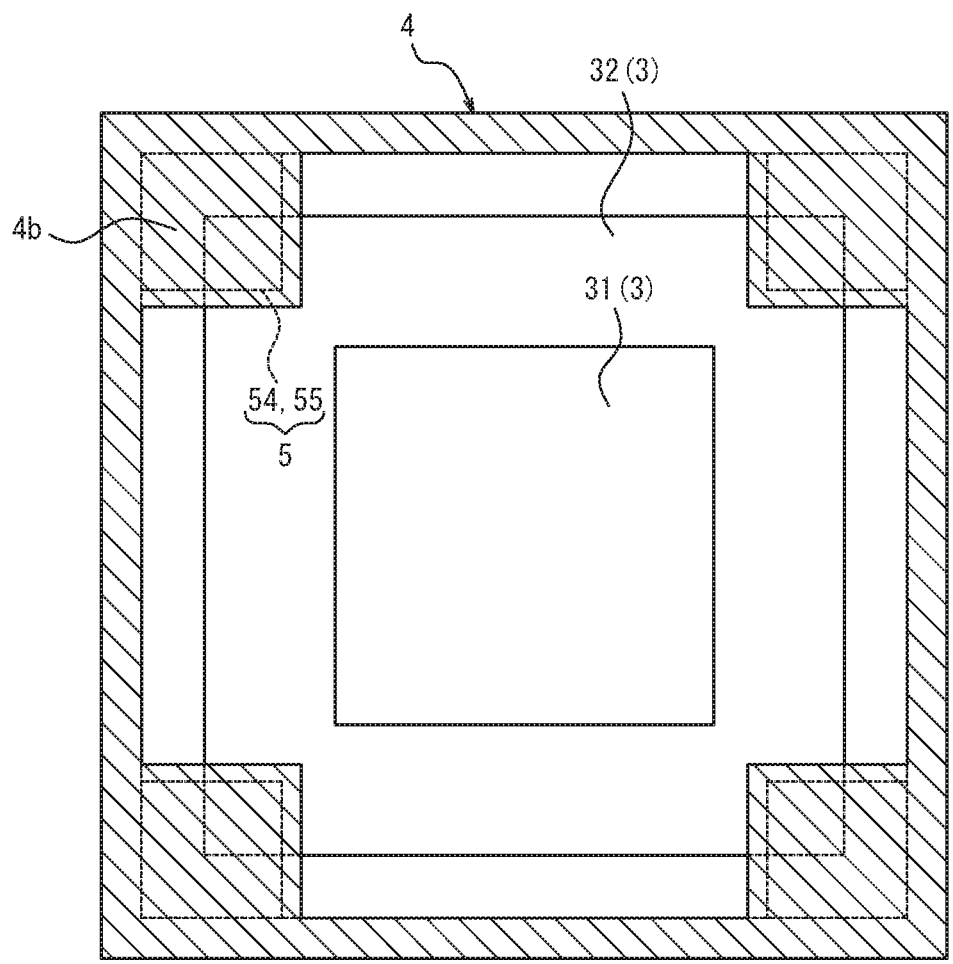
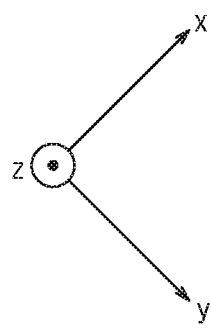

FIG. 25
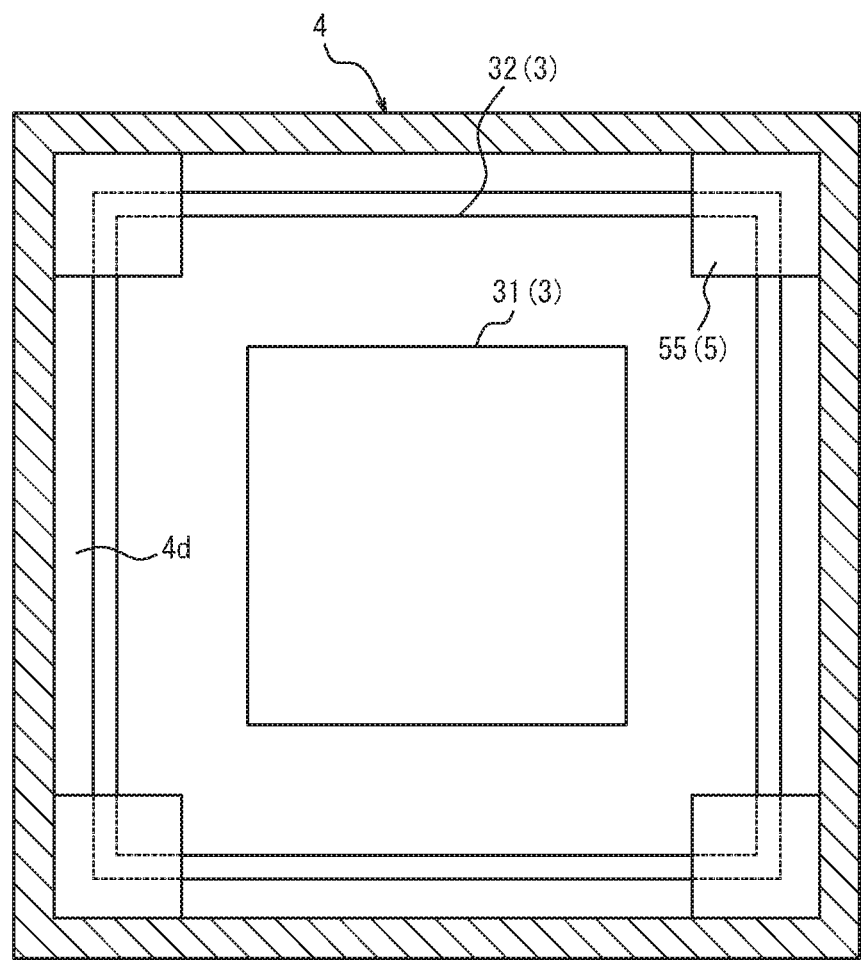
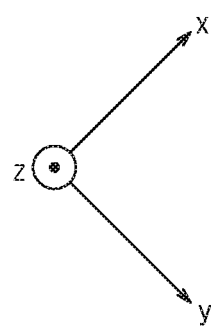

IMAGING APPARATUS, MOBILE OBJECT, AND MANUFACTURING METHOD

CROSS REFERENCE TO RELATED APPLICATION

This application claims priority to and the benefit of Japanese Patent Application No. 2017-164858 filed on Aug. 29, 2017 and Japanese Patent Application No. 2017-164859 filed on Aug. 29, 2017, the entire disclosures of which are incorporated herein by reference.

TECHNICAL FIELD

The present disclosure relates to an imaging apparatus, a mobile object, and a manufacturing method.

BACKGROUND

In an imaging apparatus, techniques for joining a substrate having an image sensor mounted thereon and a housing using an adhesive are known (for example, see PTL 1).

CITATION LIST

Patent Literature

PTL 1: JP 2010-219713 A

SUMMARY

Solution to Problem

An imaging apparatus according to an embodiment of the present disclosure comprises an imaging optical system, a holding member, an image sensor, a substrate, and a bonding member. The imaging optical system includes at least one optical element. The holding member holds the imaging optical system. The image sensor is configured to capture a subject image formed by the imaging optical system. The substrate has the image sensor mounted thereon. The bonding member fixes a substrate portion to the holding member, the substrate portion integrating the image sensor and the substrate. The bonding member is partly in contact with a surface of the substrate portion. At at least two positions in a part of the surface of the substrate portion in contact with the bonding member, the surface of the substrate portion faces different directions.

A mobile object according to an embodiment of the present disclosure comprises an imaging apparatus. The imaging apparatus includes an imaging optical system, a holding member, an image sensor, a substrate, and a bonding member. The imaging optical system includes at least one optical element. The holding member holds the imaging optical system. The image sensor is configured to capture a subject image formed by the imaging optical system. The substrate has the image sensor mounted thereon. The bonding member fixes a substrate portion to the holding member, the substrate portion integrating the image sensor and the substrate. The bonding member is partly in contact with a surface of the substrate portion. At at least two positions in a part of the surface of the substrate portion in contact with the bonding member, the surface of the substrate portion faces different directions.

A manufacturing method according to an embodiment of the present disclosure is a manufacturing method for an imaging apparatus. The imaging apparatus includes an imaging optical system, a holding member, an image sensor, a substrate, a first bonding member, and a second bonding member different from the first bonding member. The imaging optical system includes at least one optical element. The holding member holds the imaging optical system. The image sensor is configured to capture a subject image formed by the imaging optical system. The substrate has the image sensor mounted thereon. The first bonding member and the second bonding member fix a substrate portion to the holding member, the substrate portion integrating the image sensor and the substrate. The manufacturing method comprises: applying the first bonding member to a third contact portion of the holding member; bringing a first contact portion of the substrate into contact with the first bonding member applied to the third contact portion; curing the first bonding member; and applying the second bonding member to a second contact portion of the substrate different from the first contact portion and a fourth contact portion of the holding member different from the third contact portion.

Advantageous Effect

With the imaging apparatus, the mobile object, and the manufacturing method according to an embodiment of the present disclosure, misalignment of a substrate portion which integrates an image sensor and a substrate can be suppressed.

BRIEF DESCRIPTION OF THE DRAWINGS

In the accompanying drawings:

FIG. 2 is an example of a cross section along A-A in FIG. 1;

FIG. 17 is an example of a cross section along A-A in FIG. 16;

FIG. 19 is an example of a cross section along A-A in FIG. 18;

FIG. 25 is an example of a cross section along A-A in FIG. 24;

DETAILED DESCRIPTION

In a manufacturing process for the imaging apparatus as mentioned earlier, the adhesive applied between the substrate and the housing shrinks with curing. Consequently, the position of the substrate relative to the housing after curing of the adhesive differs from the position before curing of the adhesive. This can cause lower positional accuracy in the resultant imaging apparatus as the substrate is displaced from its desired position.

In the present disclosure, it is desired to provide an imaging apparatus, a mobile object, and an imaging method that suppress misalignment of a substrate portion which integrates an image sensor and a substrate.

An imaging apparatus 1 according to a first embodiment will be described below, with reference to the drawings.

Figure 1:
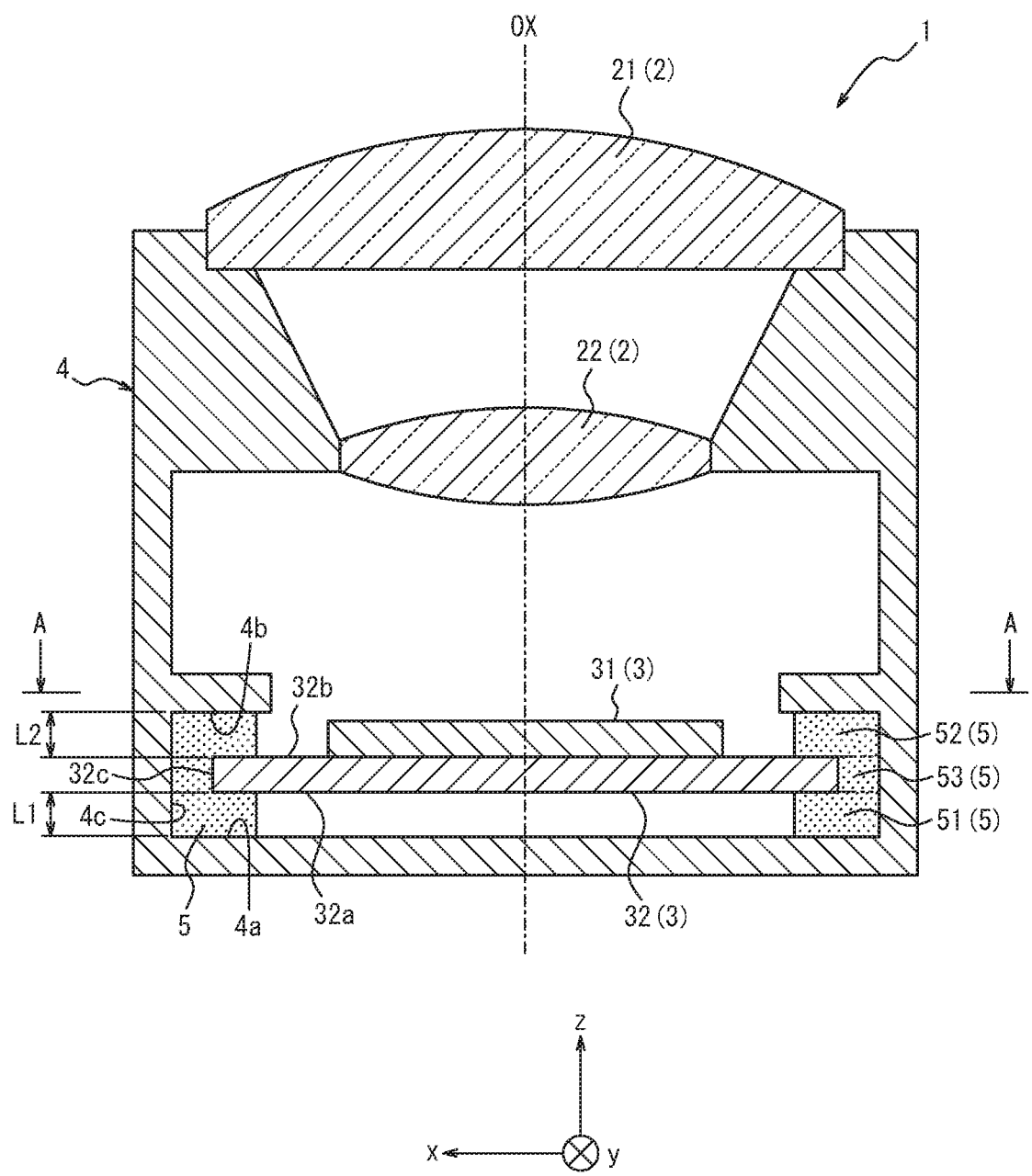
FIG. 1 is a cross-sectional view illustrating an example of a structure of an imaging apparatus according to a first embodiment.

As illustrated in FIGS. 1 and 2, the imaging apparatus 1 according to the first embodiment includes an imaging optical system 2, a substrate portion 3, a holding member 4, and a bonding member 5. The substrate portion 3 includes an image sensor 31 and a substrate 32 as one unit. Hereafter, the direction of the optical axis OX of the imaging optical system 2 is referred to as "z-axis direction". In particular, the direction from the substrate portion 3 to the imaging optical system 2 along the optical axis OX is referred to as "positive z-axis direction", and the direction from the imaging optical system 2 to the substrate portion 3 along the optical axis OX is referred to as "negative z-axis direction". One of the directions perpendicular to the z-axis direction is referred to as "x-axis direction". The direction perpendicular to the x-axis direction and the z-axis direction is referred to as "y-axis direction".

The imaging optical system 2 forms a subject image incident on the imaging apparatus 1, on an imaging surface of the image sensor 31. The imaging optical system 2 is fixed to the holding member 4. The imaging optical system 2 includes a first lens 21 and a second lens 22. The first lens 21 and the second lens 22 are collectively referred to as "lenses". The number of lenses is not limited to two, and may be one or three or more. At least a part of the lenses may be replaced with another element such as a mirror. Elements such as lenses and mirrors are collectively referred to as "optical elements". In other words, the imaging optical system 2 includes at least one optical element. The lenses may be fixed to the holding member 4 by resin such as an adhesive material. The lenses may be fixed to the holding member 4 by a fitting structure. The lenses may be fixed to the holding member 4 by screw fastening or the like.

The image sensor 31 captures the subject image formed on the imaging surface by the imaging optical system 2. Examples of the image sensor 31 include a complementary metal oxide semiconductor (CMOS) image sensor and a charge coupled device (CCD). The image sensor 31 is mounted on the substrate 32. The image sensor 31 may be fixed to the holding member 4 via an adhesive material that is in contact with the substrate 32 having the image sensor 31 mounted thereon.

The substrate 32 has different planar surfaces that are in contact with the bonding member 5. The different planar surfaces are, for example, a first substrate surface 32a (first surface) and a second substrate surface 32b (second surface) that faces the opposite direction to the facing direction of the first substrate surface 32a.

Specifically, the first substrate surface 32a may be a surface facing the negative z-axis direction in the substrate 32. The second substrate surface 32b may be a surface facing the positive z-axis direction in the substrate 32. The image sensor 31 may be mounted on the second substrate surface 32b.

The substrate 32 may be fixed to the holding member 4 via the bonding member 5. The substrate 32 may have mounted thereon not only the image sensor 31 but also a circuit for processing data of an image captured by the image sensor 31. The substrate 32 may be a printed circuit board or the like.

The holding member 4 holds the imaging optical system 2 and the substrate portion 3. Specifically, the holding member 4 may hold the imaging optical system 2 and the substrate 32 so that the optical axis OX and the focus of the imaging optical system 2 coincide on the imaging surface of the image sensor 31. The holding member 4 may contain a material such as resin. The holding member 4 is not limited to resin, and may contain any of various materials.

Specifically, the holding member 4 has a plurality of planar surfaces that face the first substrate surface 32a and the second substrate surface 32b, i.e. the different planar surfaces of the substrate portion 3 in contact with the bonding member 5, and are in contact with the bonding member 5. For example, the holding member 4 has a first holding surface 4a (third surface) facing the first substrate surface 32a, and a second holding surface 4b (fourth surface) facing a peripheral part of the second substrate surface 32b. The peripheral part is a region of the second substrate surface 32b where the image sensor 31 is not mounted. The holding member 4 may have a holding side surface 4c facing a surface (hereafter referred to as "substrate side surface 32c") of the substrate 32 orthogonal to the first substrate surface 32a and the second substrate surface 32b.

In the example illustrated in FIG. 2, the second holding surface 4b of the holding member 4 faces the corners of the substrate 32. However, the position of the second holding surface 4b is not limited to this, and the second holding surface 4b may face the peripheral part of the substrate 32. For example, the second holding surface 4b may face the peripheral part of the substrate 32 other than the corners. For example, the second holding surface 4b may face the entire peripheral part of the substrate 32.

The bonding member 5 is, for example, an ultraviolet curing adhesive. The bonding member 5 may be a thermosetting adhesive. The bonding member 5 fixes the substrate portion 3 to the holding member 4. The bonding member 5 is partly in contact with the surface of the substrate portion 3. At at least two positions in the part of the surface of the substrate portion 3 in contact with the bonding member 5, the surface of the substrate portion 3 faces different directions.

For example, the surface of the substrate portion 3 faces different directions, at at least two positions on the surface of the substrate portion 3 in contact with the bonding member 5. The surface of the substrate portion 3 at the at least two positions where the bonding member 5 is in contact may face substantially opposite directions. The at least two positions may be on the different planar surfaces constituting the surface of the substrate portion 3. The bonding member 5 may be in contact with the whole periphery of the substrate portion 3. An example in which the bonding member 5 is in contact with the substrate 32 in the substrate portion 3 will be described below.

As illustrated in FIG. 1, the bonding member 5 is in contact with two regions of the substrate 32 (for example, a region around the right end and a region around the left end in the drawing). The region around the right end and the region around the left end are each on the different planar surfaces constituting the surface of the substrate 32. In each region, the bonding member 5 is in contact with at least a part of the peripheral part of the first substrate surface 32a of the substrate 32, at least a part of the second substrate surface 32b, and at least a part of the substrate side surface 32c.

The bonding member 5 is further in contact with the holding member 4. Specifically, the bonding member 5 may be in contact with the first holding surface 4a and the second holding surface 4b of the holding member 4. The bonding member 5 may be in contact with the holding side surface 4c of the holding member 4. Hereafter, a part of the bonding member 5 between a planar surface including the first substrate surface 32a and the first holding surface 4a of the holding member 4 is referred to as "first bonding part Si", a part of the bonding member 5 between a planar surface including the second substrate surface 32b and the second holding surface 4b of the holding member 4 is referred to as "second bonding part 52", and a part of the bonding member 5 between the substrate side surface 32c and the holding side surface 4c of the holding member 4 is referred to as "side surface bonding part 53".

The volume of the first bonding part 51 and the volume of the second bonding part 52 are determined as appropriate depending on the distance to the holding member 4 in contact with the bonding member 5, the area of the holding member 4 in contact with the bonding member 5, and the like. For example, the substrate 32 may be in contact with the bonding member 5 in a plurality of separated regions, and the volume of the first bonding part 51 and the volume of the second bonding part 52 may be substantially equal in each of the plurality of regions.

Specifically, the case where a distance L1 and a distance L2 are substantially equal as illustrated in FIG. 1 will be described below. The distance L1 is the distance from the first substrate surface 32a to the first holding surface 4a. The distance L2 is the distance from the second substrate surface 32b to the second holding surface 4b. In this case, as a result of the area of the first bonding part 51 and the area of the second bonding part 52 as seen in the z-axis direction being set to be equal, the volume of the first bonding part 51 and the volume of the second bonding part 52 are substantially equal. Consequently, the pulling force in the negative z-axis direction exerted on the substrate 32 as a result of the first bonding part 51 trying to shrink with curing and the pulling force in the positive z-axis direction exerted on the substrate 32 as a result of the second bonding part 52 trying to shrink with curing are substantially equal. This can further suppress misalignment of the substrate 32 and the image sensor 31 mounted on the substrate 32.

Figure 3:
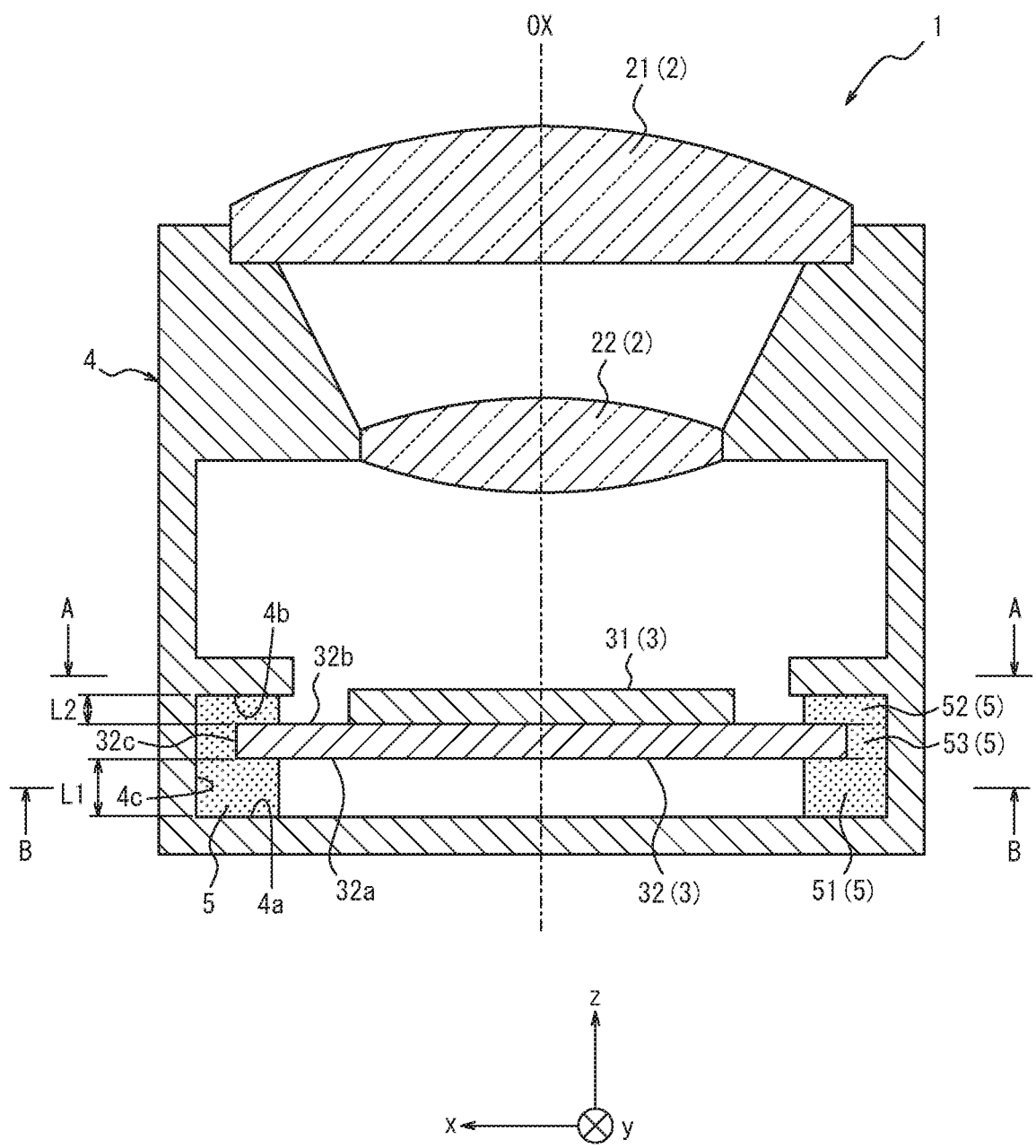
FIG. 3 is a cross-sectional view illustrating another example of the structure of the imaging apparatus according to the first embodiment.
Figure 4:
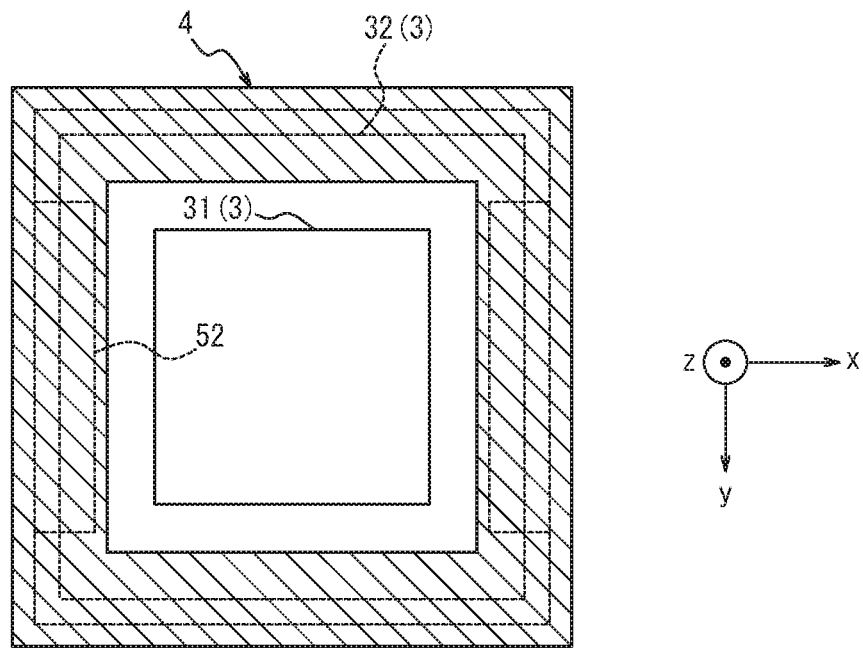
FIG. 4 is an example of a cross section along A-A in FIG. 3.
Figure 5:
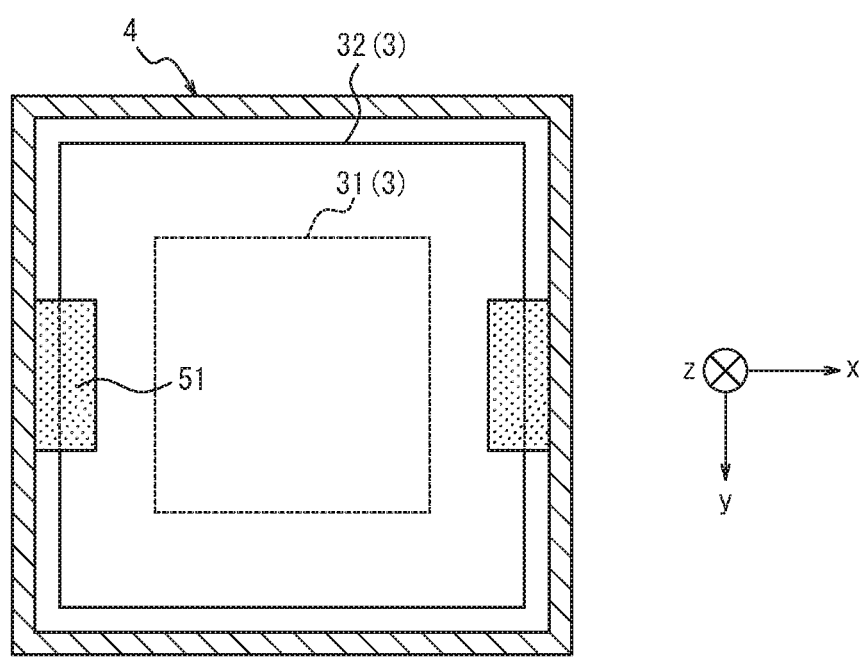
FIG. 5 is an example of a cross section along B-B in FIG. 3.

The case where the distance L1 is longer than the distance L2 as illustrated in FIG. 3 will be described below. In this case, the volume of the first bonding part 51 per unit area is larger than the volume of the second bonding part 52 per unit area. Consequently, the pulling force in the negative z-axis direction exerted on the substrate 32 due to the shrinkage of the first bonding part 51 is greater than the pulling force in the positive z-axis direction exerted on the substrate 32 due to the shrinkage of the second bonding part 52, per unit area. Accordingly, in the case where the distance L1 is longer than the distance L2, the area of the first bonding part 51 is set to be smaller than the area of the second bonding part 52 as seen in the z-axis direction, as illustrated in FIGS. 4 and 5. The second bonding part 52 thus pulls the substrate 32 in the positive z-axis direction over a wider range than the first bonding part 51. Therefore, the respective pulling forces in the positive z-axis direction and the negative z-axis direction exerted on the substrate 32 are substantially equal as a whole. This can further suppress misalignment of the substrate 32 and the image sensor 31 mounted on the substrate 32.

The side surface bonding part 53 is in contact with each of the substrate side surface 32c and the holding side surface 4c at least two positions. In the manufacturing process, the side surface bonding part 53 applied to the substrate side surface 32c of the substrate 32 and the holding side surface 4c of the holding member 4 tries to shrink with curing. Hence, a pulling force in a direction to the holding side surface 4c, i.e. a direction orthogonal to the optical axis OX direction, is exerted on the substrate 32. The side surface bonding part 53 is in contact with two or more substrate side surfaces 32c facing different directions. Therefore, pulling forces in two different directions are exerted on the substrate 32. Since the two different directions in which the substrate 32 is pulled have components in directions opposite to each other (for example, the positive x-axis direction and the negative x-axis direction), pulling forces in directions opposite to each other are exerted on the substrate 32. This can suppress misalignment of the substrate 32 and the image sensor 31 mounted on the substrate 32.

Figure 6:
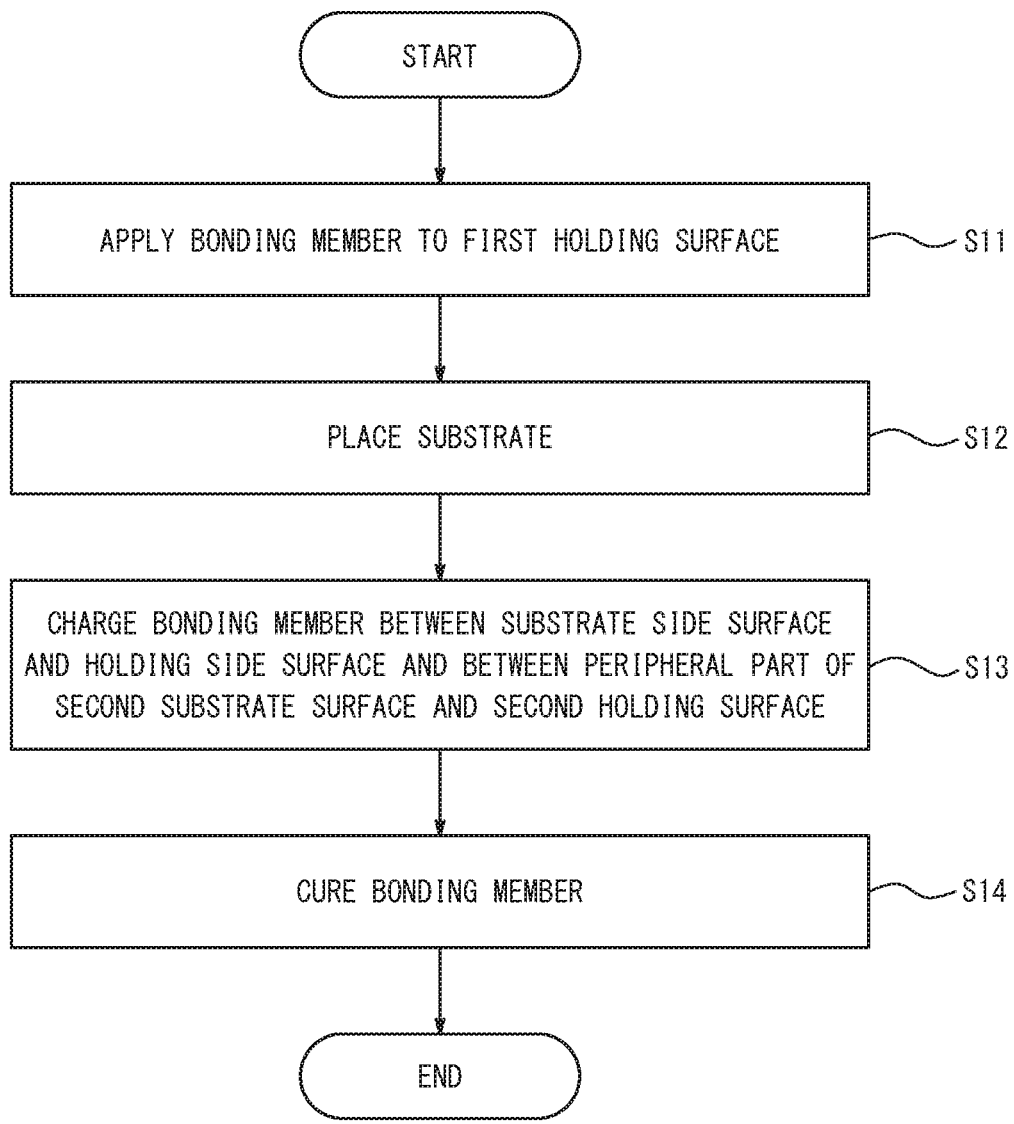
FIG. 6 is a flowchart illustrating an example of a manufacturing method for the imaging apparatus illustrated in FIG. 1.

The imaging apparatus 1 according to the first embodiment can be assembled by a manufacturing method in accordance with a procedure of the flowchart illustrated in FIG. 6.

First, the bonding member 5 is applied to the first holding surface 4a (step S11). For example, the bonding member 5 may be discretely applied to a plurality of (for example, four) regions in the first holding surface 4a corresponding to the peripheral part of the first substrate surface 32a, as illustrated in FIG. 2. The bonding member 5 may be applied so as to continuously surround the region in the first holding surface 4a corresponding to the peripheral part of the first substrate surface 32a. As a result of the bonding member 5 being applied continuously to the region corresponding to the peripheral part of the first substrate surface 32a, the substrate 32 can be firmly fixed to the holding member 4 as compared with the case where the bonding member 5 is discretely applied.

Next, the substrate 32 is placed on the first holding surface 4a via the bonding member 5 applied in step S11 (step S12). The position of the substrate 32 may be determined so that the center position of the image sensor 31 coincides with the optical axis OX of the imaging optical system 2. The position of the substrate 32 may be determined using a robotic arm or the like. Here, the bonding member 5 may be in contact with at least a part of the substrate side surface 32c of the substrate 32.

Next, the bonding member 5 is charged between the substrate side surface 32c and the holding side surface 4c and between the peripheral part of the second substrate surface 32b and the second holding surface 4b (step S13).

The bonding member 5 applied and charged in steps S11 and 13 is cured (step S14). In the case where the bonding member 5 is an ultraviolet curing adhesive, the bonding member 5 is irradiated with ultraviolet light. This cures the bonding member 5. In the case where the bonding member 5 is made of another material, a process for curing the material may be performed.

As described above, the bonding member 5 is partly in contact with the surface of the substrate 32. The surface of the substrate 32 in the part in contact with the bonding member 5 faces different directions at at least two positions. Accordingly, when the bonding member 5 shrinks, the substrate 32 is pulled in at least two different directions. Two different directions in which the substrate 32 is pulled have components in directions opposite to each other. Pulling forces in the directions opposite to each other are therefore exerted on the substrate 32. This can suppress misalignment of the substrate 32 and the image sensor 31 mounted on the substrate 32.

In the first embodiment, at least two positions where the bonding member 5 is in contact are on the different planar surfaces constituting the surface of the substrate 32. For example, the bonding member 5 is in contact with each of the first substrate surface 32a and the second substrate surface 32b of the substrate 32. Hence, when the bonding member 5 tries to shrink with curing in the manufacturing process on the first substrate surface 32a and the second substrate surface 32b of the substrate 32, pulling forces in different directions are exerted on the substrate 32. This can suppress misalignment of the substrate 32 and the image sensor 31 mounted on the substrate 32.

Figure 7:
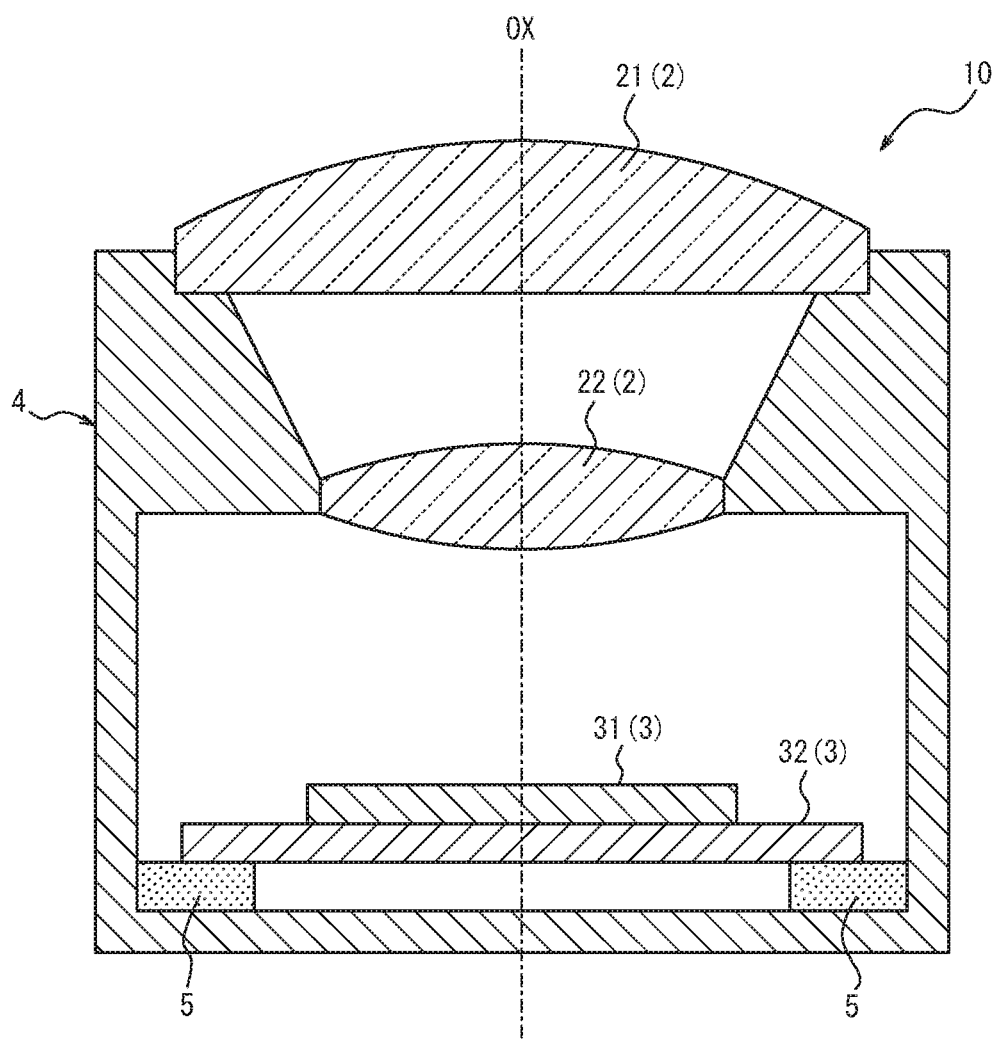
FIG. 7 is a cross-sectional view of an imaging apparatus according to a comparative example.

In the first embodiment, the holding member 4 faces the different planar surfaces of the substrate 32 in contact with the bonding member 5, and has a plurality of planar surfaces in contact with the bonding member 5. For example, the holding member 4 has the first holding surface 4a facing the first substrate surface 32a of the substrate 32, and the second holding surface 4b facing the second substrate surface 32b of the substrate 32. The bonding member 5 in contact with the first substrate surface 32a is in contact with the first holding surface 4a of the holding member 4. The bonding member 5 in contact with the second substrate surface 32b is in contact with the second holding surface 4b of the holding member 4. Accordingly, when the bonding member 5 tries to shrink with curing in the manufacturing process, a pulling force in the direction to the first holding surface 4a, i.e. the negative z-axis direction, is exerted on the substrate 32, and a pulling force in the direction to the second holding surface 4b, i.e. the positive z-axis direction, is exerted on the substrate 32. This can suppress misalignment of the substrate 32 and the image sensor 31 mounted on the substrate 32, as compared with a conventional imaging apparatus 10 illustrated in FIG. 7 in which the bonding member 5 is in contact with only one planar surface of the substrate 32.

In the first embodiment, the volume of the first bonding part 51 and the volume of the second bonding part 52 may be determined as appropriate depending on the distance to the holding member 4 in contact with the first bonding part 51 and the second bonding part 52 and the area of the holding member 4 in contact with the first bonding part 51 and the second bonding part 52. For example, the volume of the first bonding part 51 may be substantially equal to the volume of the second bonding part 52. Thus, the substrate 32 and the image sensor 31 mounted on the substrate 32 can be arranged as designed, and their misalignment can be suppressed.

After the manufacture of the imaging apparatus 1 according to the first embodiment is completed, a temperature change in the ambient environment of the imaging apparatus 1 can cause the bonding member 5 to try to shrink or expand due to rigidity. In the case where the bonding member 5 tries to shrink after manufacture, pulling forces in the direction to the first holding surface 4a and the direction to the second holding surface 4b, which are the opposite directions from the substrate 32, are exerted on the substrate 32, as described above. In the case where the bonding member 5 tries to expand, pressing forces from the first holding surface 4a side and the second holding surface 4b side, which are the opposite sides of the substrate 32, are exerted on the substrate 32, as described above. This can suppress misalignment of the substrate 32 and the image sensor 31 mounted on the substrate 32.

In the imaging apparatus 1 according to the first embodiment, the bonding member 5 may be in contact with the image sensor 31, instead of the substrate 32.

For example, the second bonding part 52 may be in contact with a part of the surface of the image sensor 31 facing the imaging optical system 2 and the second holding surface 4b. In this case, the first bonding part 51 is in contact with the first substrate surface 32a and the first holding surface 4a. Thus, when the first bonding part 51 and the second bonding part 52 try to shrink, pulling forces in the negative z-axis direction and the positive z-axis direction are exerted on the substrate 32 and the image sensor 31, as described above. This can suppress misalignment of the substrate 32 and the image sensor 31, as compared with the case where the bonding member 5 is in contact with only the first substrate surface 32a. The second bonding part 52 may be in contact with both the substrate 32 and the image sensor 31.

For example, the side surface bonding part 53 may be in contact with the edge of the image sensor 31. In this case, the side surface bonding part 53 is in contact with the holding side surface 4c facing the edge of the image sensor 31. In the case where the surface of the image sensor 31 in the part in contact with the side surface bonding part 53 faces different directions at at least two positions having components in directions opposite to each other, pulling forces in different directions having components in directions opposite to each other are exerted on the image sensor 31. This can suppress misalignment of the image sensor 31 and the substrate 32. The side surface bonding part 53 may be in contact with both the substrate 32 and the edge of the image sensor 31.

Although the above describes the case where the surface of the substrate 32 is made up of planar surfaces in the imaging apparatus 1 according to the first embodiment, the surface of the substrate 32 may have curvature. In this case, too, the surface of the substrate 32 in the part in contact with the bonding member 5 faces different directions at at least two positions, as in the case where the surface of the substrate 32 is made up of planar surfaces. Since pulling forces in different directions are exerted on the substrate 32, misalignment of the substrate 32 and the image sensor 31 can be suppressed.

An imaging apparatus 6 according to a second embodiment will be described in detail below.

Figure 8:
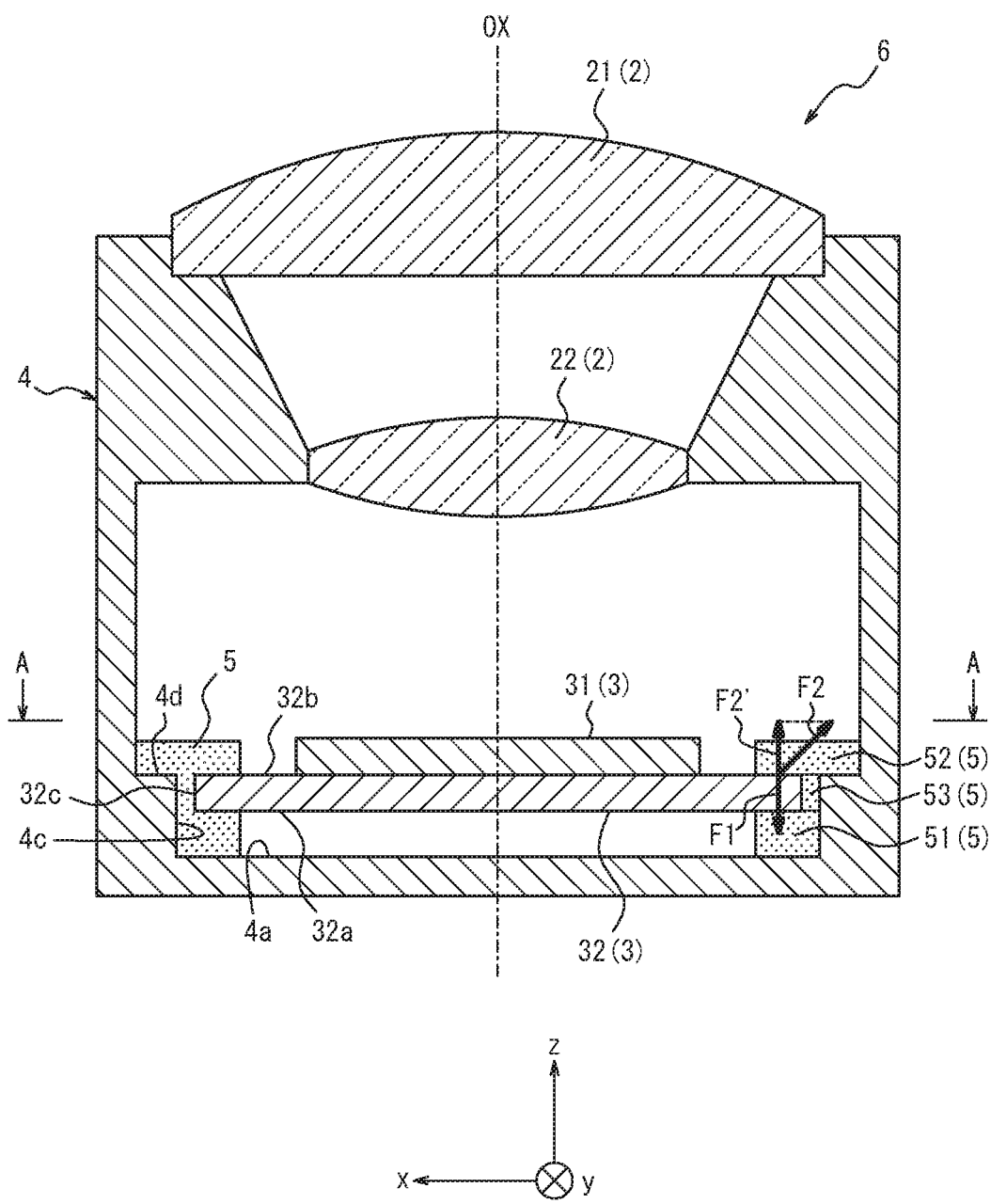
FIG. 8 is a cross-sectional view illustrating an example of a structure of an imaging apparatus according to a second embodiment.
Figure 9:
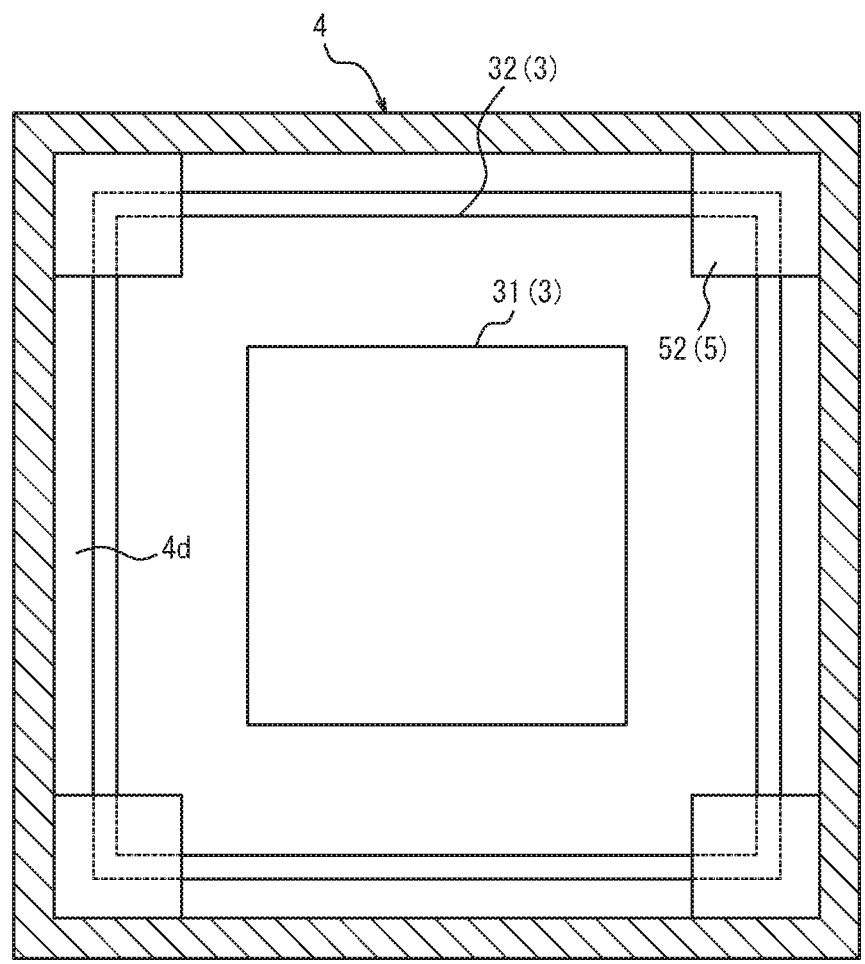
FIG. 9 is an example of a cross section along A-A in FIG. 8.

As illustrated in FIGS. 8 and 9, the imaging apparatus 6 according to the second embodiment includes an imaging optical system 2, a substrate portion 3, a holding member 4, and a bonding member 5. The substrate portion 3 includes an image sensor 31 and a substrate 32. Only the differences of the second embodiment from the first embodiment will be described below. In the second embodiment, description of the same structures as those in the first embodiment is omitted.

In the second embodiment, the holding member 4 has a first holding surface 4a facing at least a part of the first substrate surface 32a of the substrate 32, on the side of the substrate 32 opposite to the imaging optical system 2. The holding member 4 also has a third holding surface 4d (fifth surface) facing the facing direction of the second substrate surface 32b, on the imaging optical system 2 side of the substrate 32.

A first bonding part 51 is in contact with the first substrate surface 32a and the first holding surface 4a. A second bonding part 52 is in contact with the peripheral part of the second substrate surface 32b and the third holding surface 4d.

As illustrated in FIG. 8, the second bonding part 52 is in contact with the third holding surface 4d in a region displaced in the x-axis direction from the region where the second bonding part 52 is in contact with the second substrate surface 32b of the substrate 32. Accordingly, when the second bonding part 52 tries to shrink with curing, a pulling force F2 in a direction between the x-axis direction and the positive z-axis direction is exerted on the substrate 32. Consequently, a component F2' in the positive z-axis direction of the force F2 is exerted on the substrate 32. The magnitude of the force F2' is determined depending on the shrinkage ratio and shape of the bonding member 5, the position and direction of the third holding surface 4d, and the like. Meanwhile, the first bonding part 51 is in contact with the first holding surface 4a facing the first substrate surface 32a of the substrate 32. Accordingly, when the first bonding part 51 tries to shrink with curing, a pulling force F1 in the negative z-axis direction determined depending on the shrinkage ratio of the bonding member 5 is exerted on the substrate 32.

The first bonding part 51 and the second bonding part 52 may therefore be applied so that the force F1 and the force F2' approach equilibrium. This can further suppress misalignment of the substrate 32 and the image sensor 31 mounted on the substrate 32.

Figure 10:
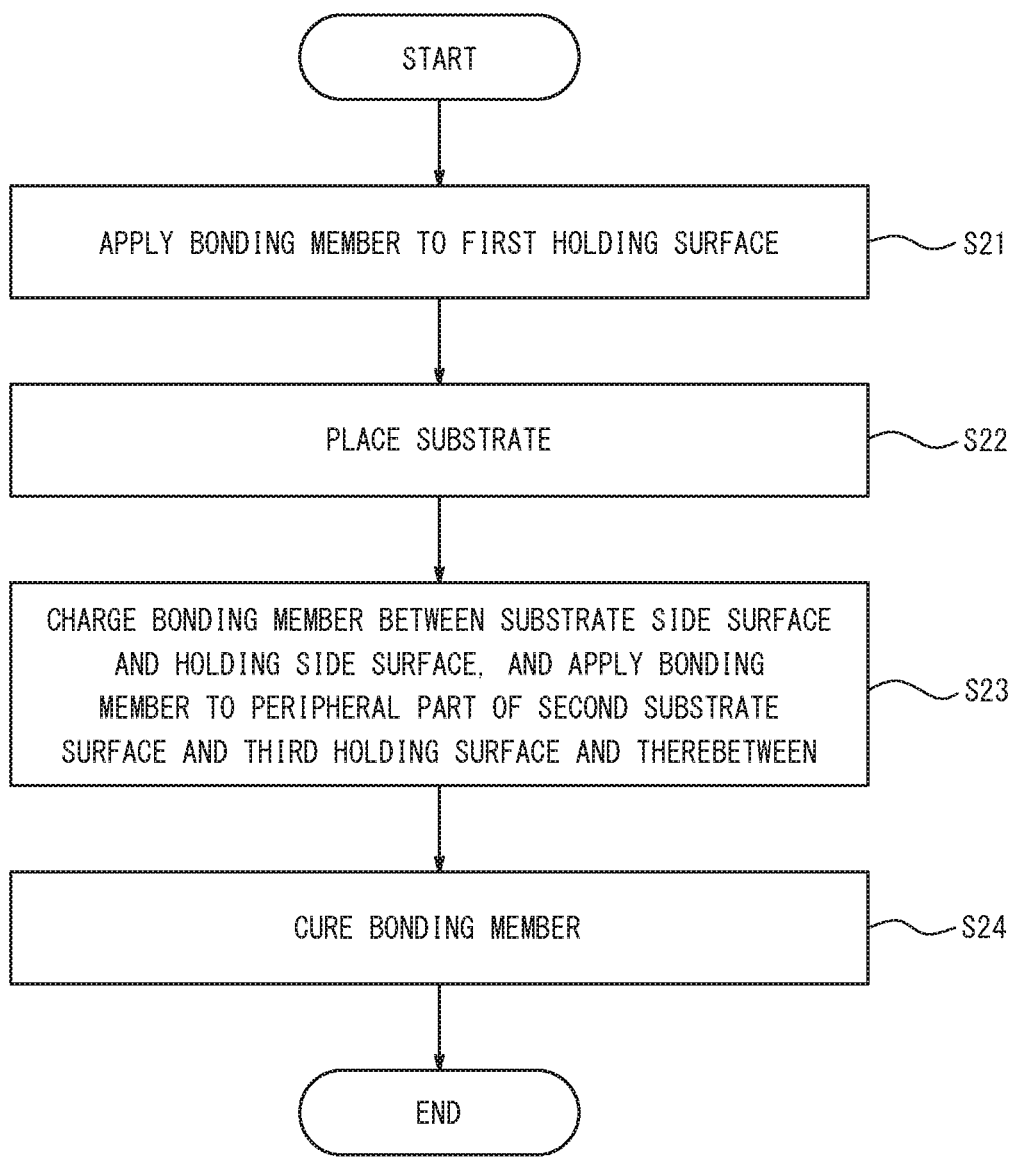
FIG. 10 is a flowchart illustrating an example of a manufacturing method for the imaging apparatus illustrated in FIG. 8.

The imaging apparatus 6 according to the second embodiment can be assembled by a manufacturing method in accordance with a procedure of the flowchart illustrated in FIG. 10.

First, the bonding member 5 is applied to the first holding surface 4a (step S21).

Next, the substrate 32 is placed on the first holding surface 4a via the bonding member 5 applied in step S21 (step S22).

Next, the bonding member 5 is charged between the substrate side surface 32c and the holding side surface 4c, and applied to the peripheral part of the second substrate surface 32b and the third holding surface 4d and therebetween (step S23).

Next, the bonding member 5 applied and charged in steps S21 and 23 is cured (step S24).

As described above, in the second embodiment, the bonding member 5 is partly in contact with the surface of the substrate 32. The surface of the substrate 32 in the part in contact with the bonding member 5 faces different directions at at least two positions. Hence, when the bonding member 5 tries to shrink, pulling forces in different directions are exerted on the substrate 32, so that misalignment of the substrate 32 and the image sensor 31 mounted on the substrate 32 during manufacture can be suppressed.

In the second embodiment, the holding member 4 has the first holding surface 4a facing at least a part of the first substrate surface 32a of the substrate 32, on the side of the substrate 32 opposite to the imaging optical system 2. The holding member 4 also has the third holding surface 4d facing the facing direction of the second substrate surface 32b, on the imaging optical system 2 side of the substrate 32. Accordingly, when the bonding member 5 applied to the first substrate surface 32a of the substrate 32 and the first holding surface 4a of the holding member 4 tries to shrink with curing in the manufacturing process, a pulling force in the negative z-axis direction is exerted on the substrate 32. When the bonding member 5 applied to the second substrate surface 32b of the substrate 32 and the third holding surface 4d of the holding member 4 tries to shrink with curing in the manufacturing process, a pulling force having a component in the positive z-axis direction is exerted on the substrate 32. This can suppress misalignment of the substrate 32 and the image sensor 31 mounted on the substrate 32.

In the case where, after the manufacture of the imaging apparatus 6 according to the second embodiment is completed, a temperature change in the ambient environment of the imaging apparatus 6 causes the bonding member 5 to try to shrink or expand due to rigidity, misalignment of the substrate 32 and the image sensor 31 mounted on the substrate 32 can be suppressed as in the first embodiment.

In the imaging apparatus 6 according to the second embodiment, the bonding member 5 may be in contact with the image sensor 31. In this case, the substrate 32 mounted on the image sensor 31 is fixed to the holding member 4 via the bonding member 5. This can suppress misalignment of the substrate 32 and the image sensor 31, as in the first embodiment.

An imaging apparatus 7 according to a third embodiment will be described in detail below.

Figure 11:
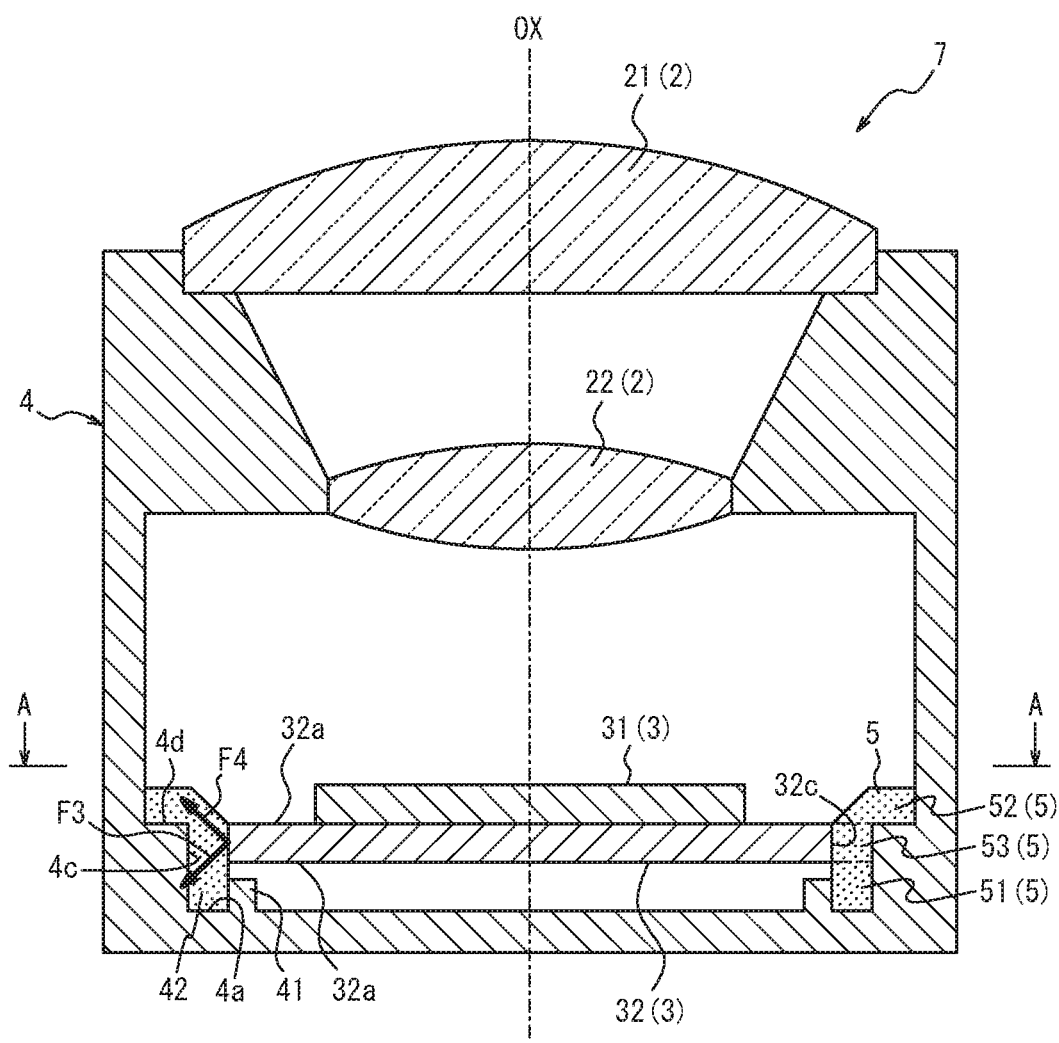
FIG. 11 is a cross-sectional view illustrating an example of a structure of an imaging apparatus according to a third embodiment.
Figure 12:
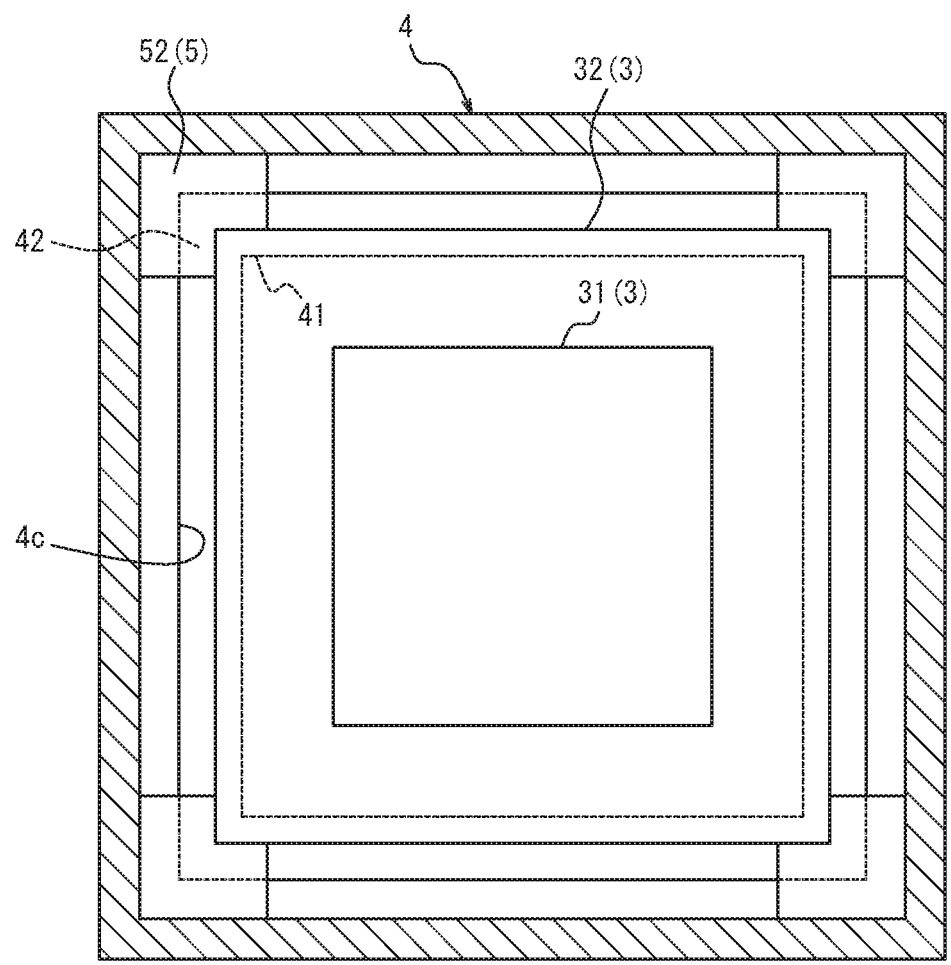
FIG. 12 is an example of a cross section along A-A in FIG. 11.

As illustrated in FIGS. 11 and 12, the imaging apparatus 7 according to the third embodiment includes an imaging optical system 2, a substrate portion 3, a holding member 4, and a bonding member 5. The substrate portion 3 includes an image sensor 31 and a substrate 32. The holding member 4 has a first holding surface 4a, a third holding surface 4d, and a holding side surface 4c, as in the second embodiment. Only the differences of the third embodiment from the second embodiment will be described below. In the third embodiment, description of the same structures as those in the second embodiment is omitted.

The holding member 4 may further have a groove wall portion 41. The groove wall portion 41 may be fixed to the first holding surface 4a. The groove wall portion 41 may be integral with the first holding surface 4a. The groove wall portion 41 defines a groove 42 together with the holding side surface 4c. The groove 42 is located to prevent the bonding member 5 applied to the substrate side surface 32c, the first holding surface 4a, and the holding side surface 4c from adhering to the first substrate surface 32a of the substrate 32. For example, the groove 42 is at the edge of the substrate 32 or outside the substrate 32 in the x-axis direction with respect to the optical axis OX.

The bonding member 5 is in contact with at least a part of the substrate side surface 32c. The bonding member 5 is not in contact with the first substrate surface 32a and the second substrate surface 32b of the substrate 32. The bonding member 5, as a result of being charged into the groove 42, is in contact with a region of the first holding surface 4a of the holding member 4 not facing the substrate 32. The bonding member 5 is in contact with the third holding surface 4d of the holding member 4, the groove 42, and the holding side surface 4c.

The bonding member 5 is in contact with the substrate side surface 32c of the substrate 32 in each of at least two regions (for example, a region around the right end and a region around the left end in FIG. 11). The bonding member 5 in contact with the substrate side surface 32c may be in contact with different regions of the holding side surface 4c of the holding member 4.

Figure 13:
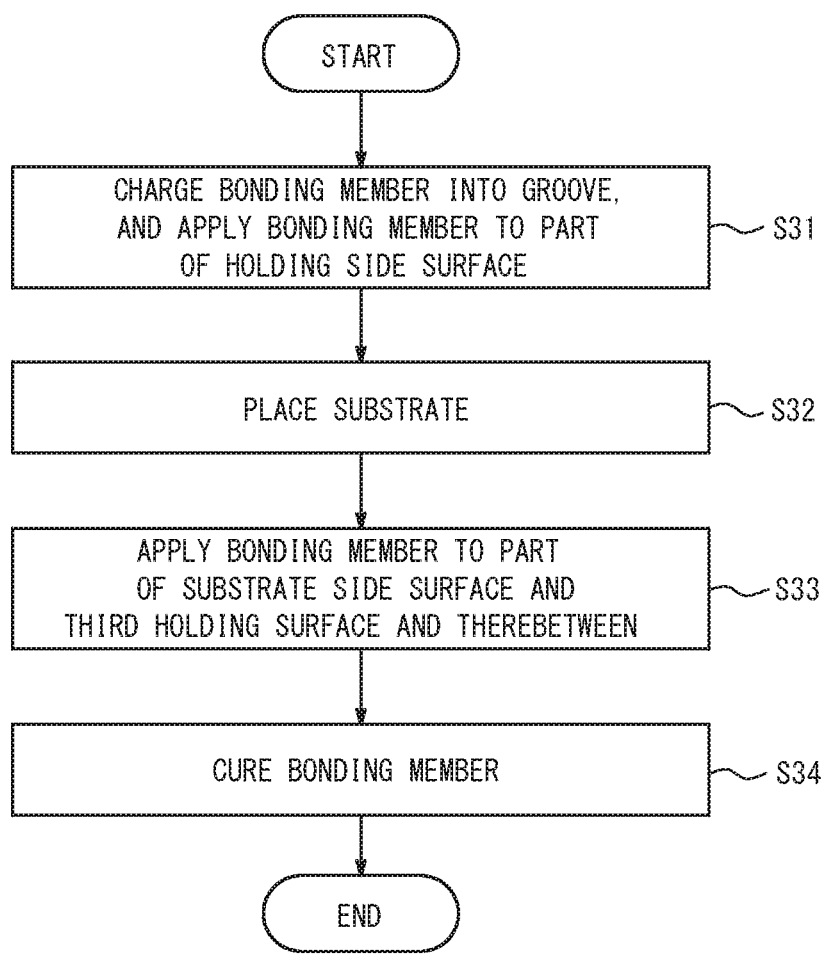
FIG. 13 is a flowchart illustrating an example of a manufacturing method for the imaging apparatus illustrated in FIG. 11.

The imaging apparatus 7 according to the third embodiment can be assembled by a manufacturing method in accordance with a procedure of the flowchart illustrated in FIG. 13.

First, the bonding member 5 is charged into the groove 42, and applied to a part of the holding side surface 4c (step S31).

Next, the substrate 32 is placed so that the substrate side surface 32c is in contact with the bonding member 5 applied to the part of the holding side surface 4c in step S31 (step S32).

Next, the bonding member 5 is applied to a part of the substrate side surface 32c of the substrate 32 and the third holding surface 4d and therebetween (step S33).

Next, the bonding member 5 applied and charged in steps S31 and 33 is cured (step S34).

As described above, in the third embodiment, the first bonding part 51 is in contact with the substrate side surface 32c and the region of the first holding surface 4a not facing the first substrate surface 32a. In the manufacturing process, the bonding member 5 applied to the first holding surface 4a and the substrate side surface 32c tries to shrink with curing.

Hence, a pulling force F3 in a direction from the substrate side surface 32c toward the first holding surface 4a is exerted on the substrate 32. The bonding member 5 is also in contact with the third holding surface 4d. In the manufacturing process, the bonding member 5 applied to the third holding surface 4d and the substrate side surface 32c tries to shrink with curing. Hence, a pulling force F4 in a direction from the substrate side surface 32c toward the third holding surface 4d of the holding member 4 is exerted on the substrate 32.

The substrate 32 is thus pulled by each of the component in the negative z-axis direction of the force F3 and the component in the positive z-axis direction of the force F4, in the optical axis OX direction. This can suppress misalignment of the substrate 32 and the image sensor 31 mounted on the substrate 32, as compared with the imaging apparatus 10 according to the comparative example in FIG. 7 in which the bonding member 5 is in contact with only the first holding surface 4a of the holding member 4.

In the third embodiment, the first holding surface 4a of the holding member 4 has the groove 42. Hence, when the bonding member 5 is applied to the first holding surface 4a in the manufacturing process, the bonding member 5 is kept from flowing between the first substrate surface 32a and the first holding surface 4a. Since the bonding member 5 is not applied to the first substrate surface 32a, misalignment of the substrate 32 in the negative z-axis direction due to the shrinkage of the bonding member 5 can be suppressed.

In the third embodiment, the first bonding part 51 and the second bonding part 52 may be applied depending on the shrinkage ratio or rigidity coefficient of the bonding member 5, as in the second embodiment. The first bonding part 51 and the second bonding part 52 may be applied depending on the position and direction of the holding member 4 in contact with the first bonding part 51 and the second bonding part 52, the area of the holding member 4 in contact with the first bonding part 51 and the second bonding part 52, and the like.

After the manufacture of the imaging apparatus 7 according to the third embodiment is completed, a temperature change in the ambient environment of the imaging apparatus 7 can cause the bonding member 5 to try to shrink or expand due to rigidity. In this case, misalignment of the substrate 32 and the image sensor 31 mounted on the substrate 32 can be suppressed, as in the first embodiment.

In the imaging apparatus 7 according to the third embodiment, the bonding member 5 may be in contact with the image sensor 31. In this case, the substrate 32 mounted on the image sensor 31 is fixed to the holding member 4 via the bonding member 5. This can suppress misalignment of the substrate 32 and the image sensor 31, as in the first embodiment.

An imaging apparatus 8 according to a fourth embodiment will be described in detail below.

Figure 14:
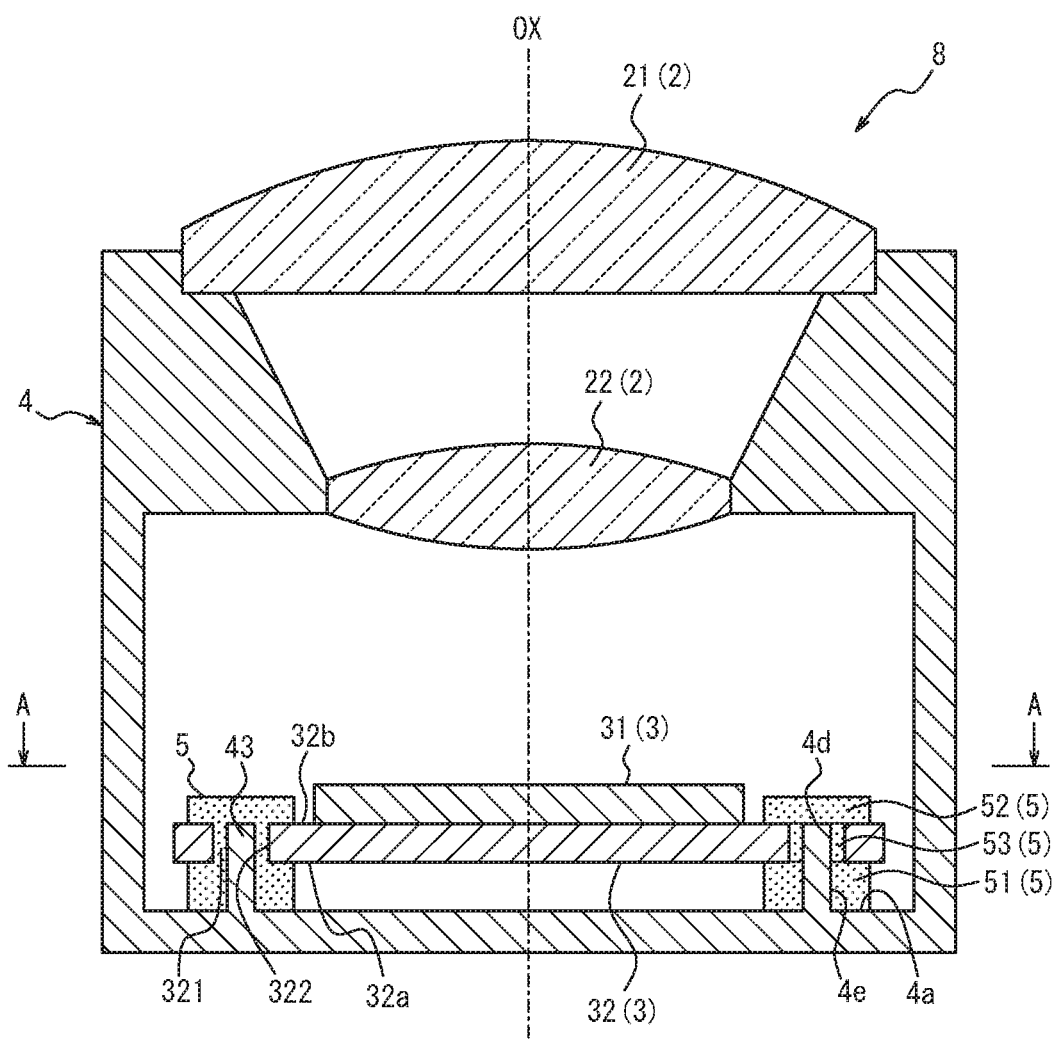
FIG. 14 is a cross-sectional view illustrating an example of a structure of an imaging apparatus according to a fourth embodiment.
Figure 15:
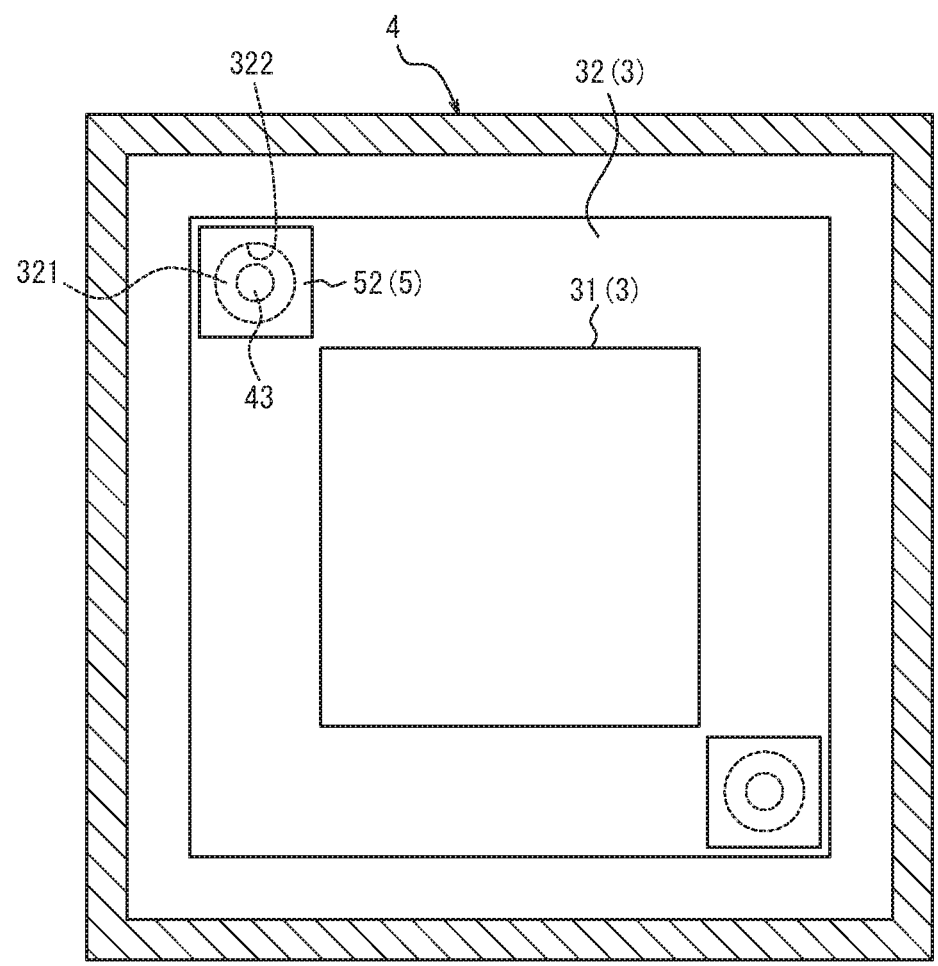
FIG. 15 is an example of a cross section along A-A in FIG. 14.

As illustrated in FIGS. 14 and 15, the imaging apparatus 8 according to the fourth embodiment includes an imaging optical system 2, a substrate portion 3, a holding member 4, and a bonding member 5. The substrate portion 3 includes an image sensor 31 and a substrate 32. Only the differences of the fourth embodiment from the second embodiment will be described below. In the fourth embodiment, description of the same structures as those in the second embodiment is omitted.

In the fourth embodiment, the substrate 32 has a hole wall 322 defining at least one through hole 321. The length of the through hole 321 in a direction perpendicular to the through direction of the through hole 321 is determined based on the relationships among the substrate 32, the image sensor 31, and the below-described projection 43 of the holding member 4. The through hole 321 may be circular as seen in the z-axis direction. The through hole 321 may have any shape such as elliptical, quadrangular, or triangular as seen in the z-axis direction.

The holding member 4 has the projection 43 that at least partly extends into the through hole 321, in a part corresponding to the through hole 321. The length of the projection 43 in a direction perpendicular to the optical axis OX is at least shorter than the corresponding length of the through hole 321. The projection 43 may be circular as seen in the z-axis direction. The projection 43 may have any shape such as elliptical, quadrangular, or triangular as seen in the z-axis direction.

The holding member 4 has a first holding surface 4a facing the first substrate surface 32a. The projection 43 has a third holding surface 4d facing the facing direction of the second substrate surface 32b of the substrate 32, on the imaging optical system 2 side of the substrate 32. The projection 43 has a projection side surface 4e facing the hole wall 322.

The bonding member 5 is in contact with the substrate 32 at the inner periphery of the through hole 321 and in the regions of both surfaces, between which the through hole 321 is interposed, around the through hole 321, and is in contact with the holding member 4 at and around the projection 43. Specifically, the first bonding part 51 may be in contact with the first substrate surface 32a, the first holding surface 4a, and the projection side surface 4e. The second bonding part 52 may be in contact with the peripheral part of the second substrate surface 32b and the third holding surface 4d. The side surface bonding part 53 may be in contact with the hole wall 322 and the projection side surface 4e.

The imaging apparatus 8 according to the fourth embodiment can be assembled by the same manufacturing method as the manufacturing method according to the second embodiment illustrated in FIG. 10, except the following: In the manufacturing method according to the fourth embodiment, in step S23, the bonding member 5 is charged not between the substrate side surface 32c and the holding side surface 4c but between the hole wall 322 and the projection side surface 4e. In step S24, the bonding member 5 is applied not to the peripheral part of the second substrate surface 32b and the third holding surface 4d and therebetween, but to the second substrate surface 32b around the hole wall 322 and the third holding surface 4d and therebetween.

As described above, misalignment of the substrate 32 and the image sensor 31 mounted on the substrate 32 can be suppressed in the imaging apparatus 8 according to the fourth embodiment, for the same reasons as in the imaging apparatus 6 according to the second embodiment.

In the fourth embodiment, the bonding member 5 may be applied depending on the shrinkage ratio or rigidity coefficient of the bonding member 5, as in the second embodiment. The bonding member 5 may be applied depending on the position and direction of the holding member 4 in contact with the bonding member 5, the area of the holding member 4 in contact with the bonding member 5, and the like.

After the manufacture of the imaging apparatus 8 according to the fourth embodiment is completed, a temperature change in the ambient environment of the imaging apparatus 8 can cause the bonding member 5 to try to shrink or expand due to rigidity. In this case, misalignment of the substrate 32 and the image sensor 31 mounted on the substrate 32 can be suppressed, as in the first embodiment.

In the imaging apparatus 8 according to the fourth embodiment, the bonding member 5 may be in contact with the image sensor 31. In this case, the substrate 32 mounted on the image sensor 31 is fixed to the holding member 4 via the bonding member 5. This can suppress misalignment of the substrate 32 and the image sensor 31, as in the first embodiment.

An imaging apparatus 9 according to a fifth embodiment will be described in detail below.

Figure 16:
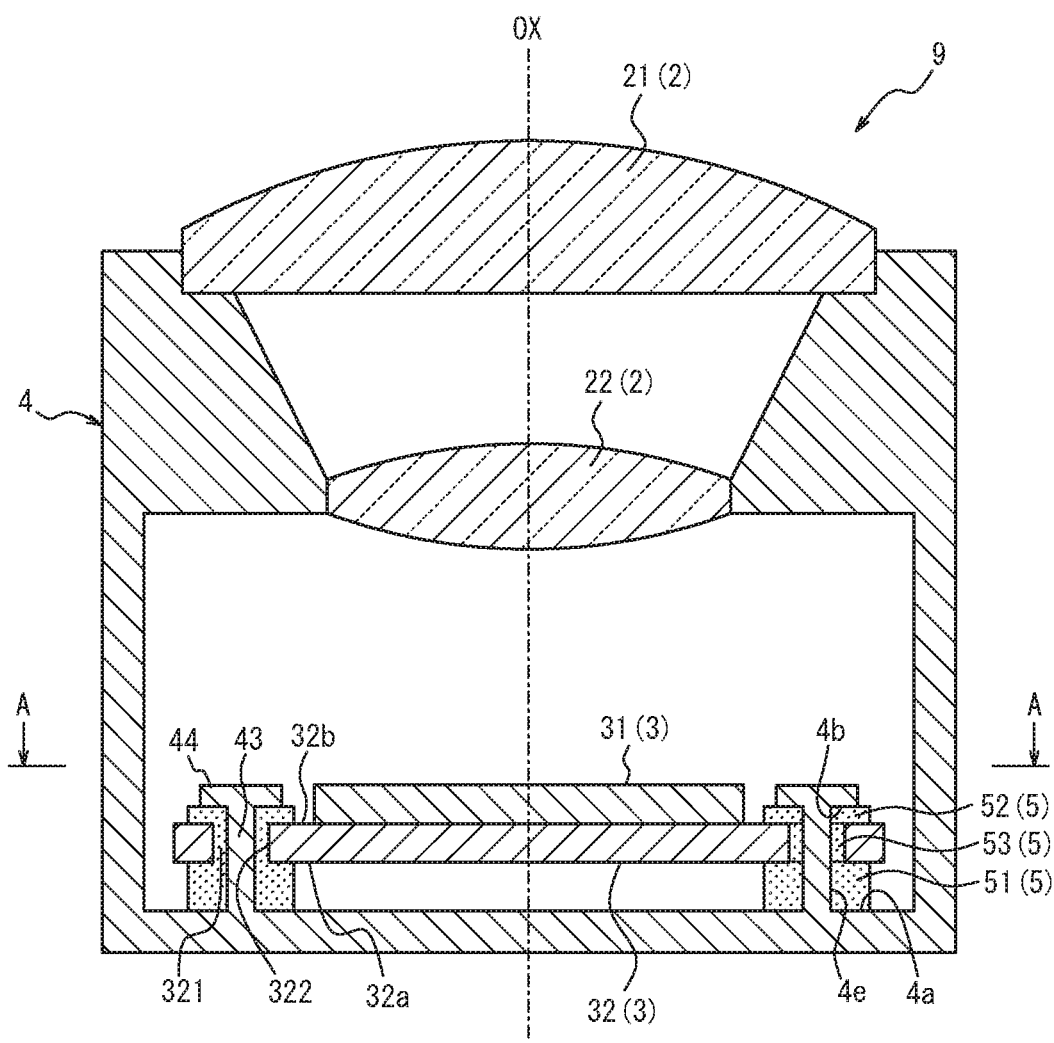
FIG. 16 is a cross-sectional view illustrating an example of a structure of an imaging apparatus according to a fifth embodiment.

As illustrated in FIGS. 16 and 17, the imaging apparatus 9 according to the fifth embodiment includes an imaging optical system 2, a substrate portion 3, a holding member 4, and a bonding member 5. The substrate portion 3 includes an image sensor 31 and a substrate 32. The substrate 32 has a hole wall 322 defining at least one through hole 321. Only the differences of the fifth embodiment from the fourth embodiment will be described below. In the fifth embodiment, description of the same structures as those in the fourth embodiment is omitted.

The holding member 4 has a projection 43 passing through the through hole 321. The holding member 4 has an overhang 44 that overhangs from the tip of the projection 43 in a direction along the substrate 32. The overhang 44 may be integral with the projection 43. The overhang 44 may be fixed to the projection 43.

The bonding member 5 is in contact with the substrate 32 at the inner periphery of the through hole 321 and in the regions of both surfaces, between which the through hole 321 is interposed, around the through hole 321, and is in contact with the holding member 4 at and around the projection 43, as in the fourth embodiment. Specifically, the first bonding part 51 may be in contact with the first substrate surface 32a, the first holding surface 4a, and the projection side surface 4e. The second bonding part 52 may be in contact with the peripheral part of the through hole 321 in the second substrate surface 32b, the second holding surface 4b, and the projection side surface 4e. The side surface bonding part 53 may be in contact with the hole wall 322 and the projection side surface 4e.

The imaging apparatus 9 according to the fifth embodiment can be assembled by the same manufacturing method as the manufacturing method according to the first embodiment illustrated in FIG. 6, except the following: In the manufacturing method according to the fifth embodiment, in step S13, the second bonding part 52 is charged not between the substrate side surface 32c and the holding side surface 4c but between the hole wall 322 and the projection side surface 4e of the projection 43.

As described above, misalignment of the substrate 32 and the image sensor 31 mounted on the substrate 32 can be suppressed in the imaging apparatus 9 according to the fifth embodiment, for the same reasons as in the imaging apparatus 1 according to the first embodiment.

In the fifth embodiment, the volume of the first bonding part 51 and the volume of the second bonding part 52 may be determined depending on the distance to the holding member 4 in contact with the first bonding part 51 and the second bonding part 52, the area of the holding member 4 in contact with the first bonding part 51 and the second bonding part 52, and the like, as in the first embodiment. For example, the volume of the first bonding part 51 and the volume of the second bonding part 52 may be equal.

After the manufacture of the imaging apparatus 9 according to the fifth embodiment is completed, a temperature change in the ambient environment of the imaging apparatus 9 can cause the bonding member 5 to try to shrink or expand due to rigidity. In this case, misalignment of the substrate 32 and the image sensor 31 mounted on the substrate 32 can be suppressed, as in the first embodiment.

In the imaging apparatus 9 according to the fifth embodiment, the bonding member 5 may be in contact with the image sensor 31. In this case, the substrate 32 mounted on the image sensor 31 is fixed to the holding member 4 via the bonding member 5. This can suppress misalignment of the substrate 32 and the image sensor 31, as in the first embodiment.

An imaging apparatus 11 according to a sixth embodiment will be described in detail below.

Figure 18:
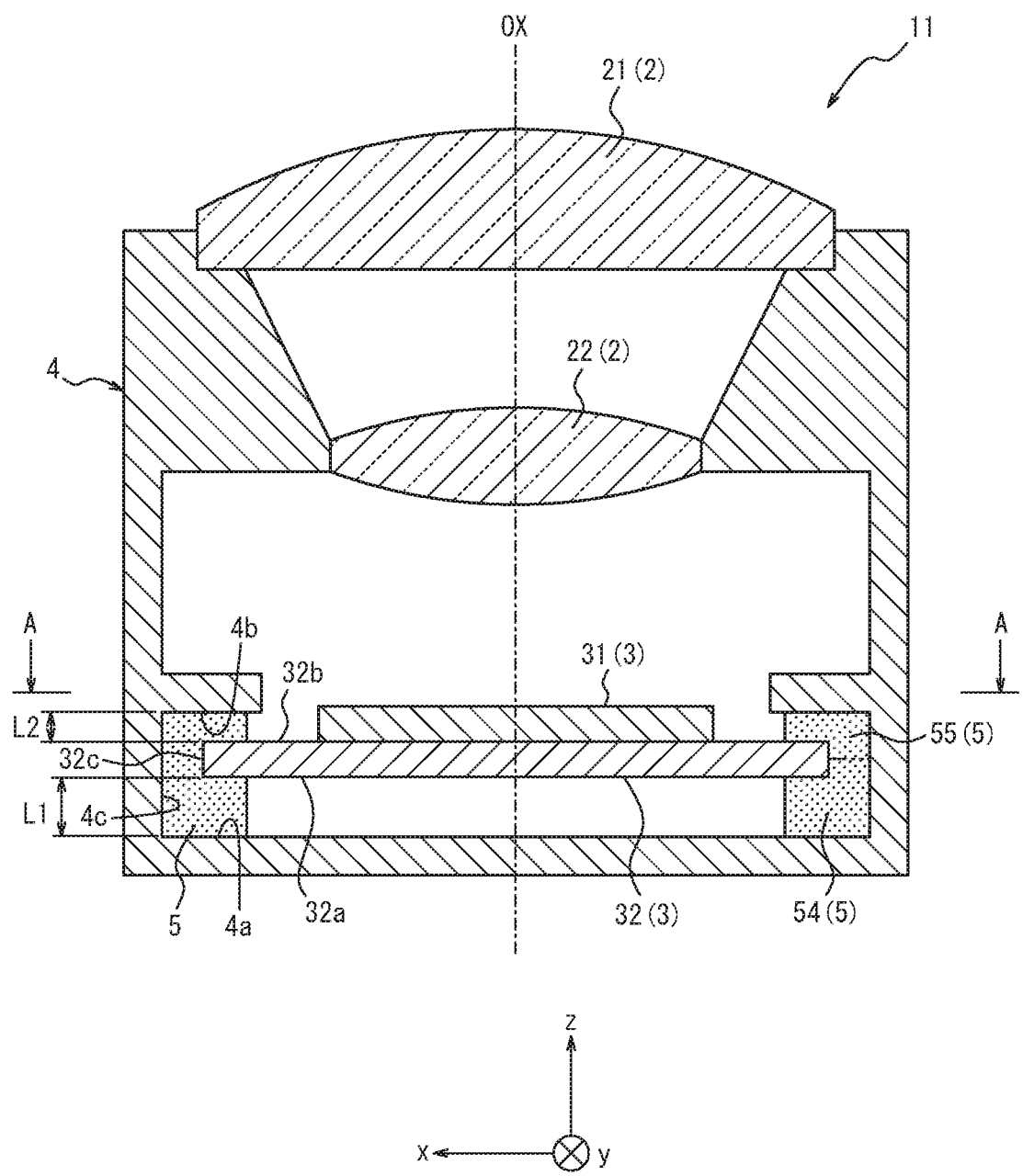
FIG. 18 is a cross-sectional view illustrating an example of a structure of an imaging apparatus according to a sixth embodiment.

As illustrated in FIGS. 18 and 19, the imaging apparatus 11 according to the sixth embodiment includes an imaging optical system 2, a substrate portion 3, a holding member 4, and a bonding member 5. Only the differences of the sixth embodiment from the first embodiment will be described below. In the sixth embodiment, description of the same structures as those in the first embodiment is omitted.

The bonding member 5 includes a first bonding member 54 and a second bonding member 55 different from the first bonding member 54. The bonding member 5 is integrally formed by the first bonding member 54 and the second bonding member 55 layered in the z-axis direction. For example, the first bonding member 54 may be an ultraviolet curing adhesive, and the second bonding member 55 may be a thermosetting adhesive. The first bonding member 54 and the second bonding member 55 are, however, not limited to such, and the first bonding member 54 may be a thermosetting adhesive and the second bonding member 55 may be an ultraviolet curing adhesive. The first bonding member 54 and the second bonding member 55 may both be an ultraviolet curing adhesive. The first bonding member 54 and the second bonding member 55 may both be a thermosetting adhesive.

The shrinkage ratio of the second bonding member 55 may be different from the shrinkage ratio of the first bonding member 54. The elastic modulus of the second bonding member 55 after curing may be different from the elastic modulus of the first bonding member 54 after curing.

An example in which the first bonding member 54 is in contact with the substrate 32 in the substrate portion 3 will be described below. For example, the first bonding member 54 may be in contact with the first substrate surface 32a as a first substrate contact portion of the surface of the substrate portion 3. The second bonding member 55 may be in contact with the second substrate surface 32b as a second substrate contact portion of the surface of the substrate portion 3.

The first bonding member 54 may be in contact with a first holding contact portion of the holding member 4. Specifically, the first bonding member 54 may be in contact with the first holding surface 4a as the first holding contact portion. The second bonding member 55 may be in contact with a second holding contact portion of the holding member 4. Specifically, the second bonding member 55 may be in contact with the second holding surface 4b as the second holding contact portion. The direction from the first substrate contact portion to the first holding contact portion (direction along the negative z-axis direction in the example in FIG. 18) and the direction from the second substrate contact portion to the second holding contact portion (direction along the positive z-axis direction in the example in FIG. 18) are different directions. The first bonding member 54 and the second bonding member 55 may be in contact with the holding side surface 4c of the holding member 4.

The volume of the first bonding member 54 between the first substrate contact portion (first substrate surface 32a) and the first holding contact portion (first holding surface 4a) and the volume of the second bonding member 55 between the second substrate contact portion (second substrate surface 32b) and the second holding contact portion (second holding surface 4b) are determined as appropriate by design. Hereafter, the volume of the first bonding member 54 between the first substrate contact portion and the first holding contact portion is referred to as the "volume of the first bonding part", and the volume of the second bonding member 55 between the second substrate contact portion and the second holding contact portion is referred to as the "volume of the second bonding part".

Specifically, the volume of the first bonding part and the volume of the second bonding part may be determined depending on the distance to the holding member 4 in contact with each of the first bonding member 54 and the second bonding member 55, the area of the holding member 4 in contact with each of the first bonding member 54 and the second bonding member 55, and the like. The volume of the first bonding part and the volume of the second bonding part may be determined as appropriate depending on the positions and directions of the first holding surface 4a and the second holding surface 4b of the holding member 4 and the like. For example, the volume of the first bonding part may be larger than the volume of the second bonding part in the case where the shrinkage ratio of the first bonding member 54 is lower than the shrinkage ratio of the second bonding member 55.

Specifically, the case where the area of the first bonding member 54 and the area of the second bonding member 55 as seen in the z-axis direction are substantially equal will be described below. In the case where the shrinkage ratio of the first bonding member 54 is lower than the shrinkage ratio of the second bonding member 55, the pulling force in the negative z-axis direction exerted on the substrate 32 due to the curing of the first bonding member 54 per unit volume is less than the pulling force in the positive z-axis direction exerted on the substrate 32 due to the curing of the second bonding member 55 per unit volume. Accordingly, in the case where the area of the first bonding member 54 and the area of the second bonding member 55 as seen in the z-axis direction are equal, setting the distance L1 to be longer than the distance L2 results in the volume of the first bonding part being larger than the volume of the second bonding part, as illustrated in FIG. 18. The distance L1 is the distance from the first substrate surface 32a of the substrate 32 to the first holding surface 4a of the holding member 4. The distance L2 is the distance from the second substrate surface 32b of the substrate 32 to the second holding surface 4b of the holding member 4. Thus, the pulling force in the positive z-axis direction and the pulling force in the negative z-axis direction exerted on the substrate 32 approach equilibrium. Each volume can be determined so that the pulling force in the positive z-axis direction and the pulling force in the negative z-axis direction exerted on the substrate 32 approach equilibrium. This can suppress misalignment of the substrate 32 and the image sensor 31 mounted on the substrate 32.

Figure 20:
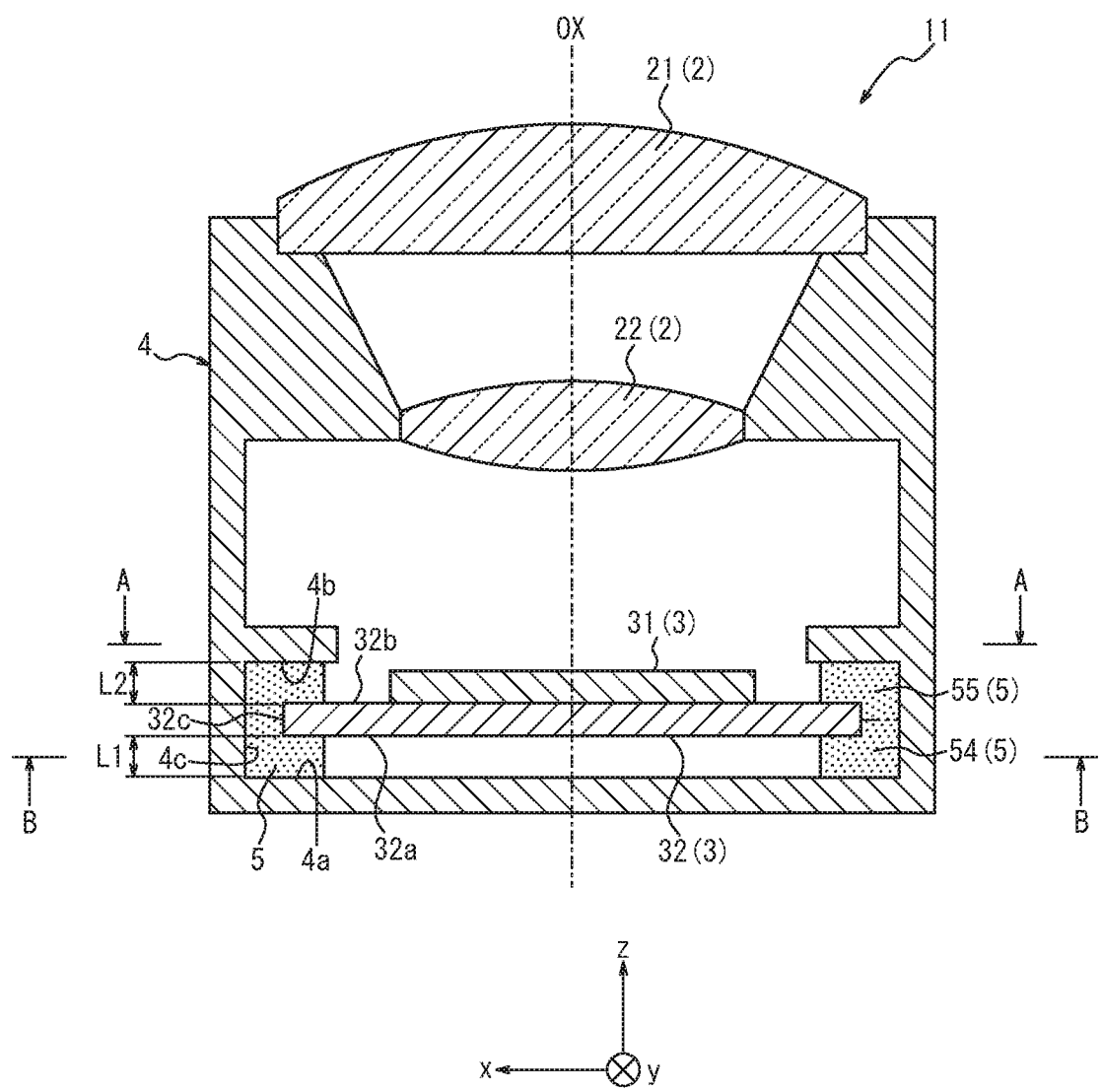
FIG. 20 is a cross-sectional view illustrating another example of the structure of the imaging apparatus according to the sixth embodiment.
Figure 21:
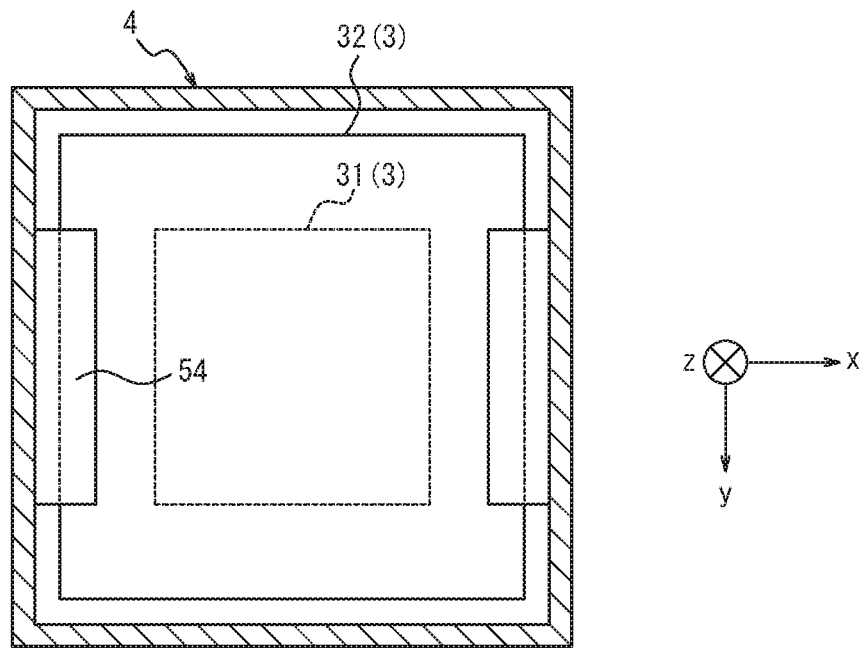
FIG. 21 is an example of a cross section along A-A in FIG. 20.
Figure 22:
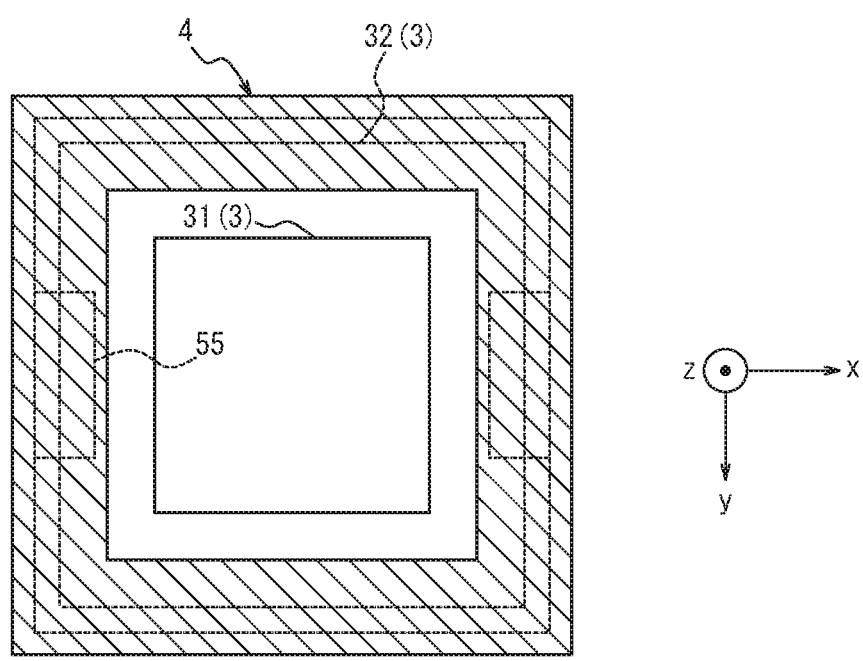
FIG. 22 is an example of a cross section along B-B in FIG. 20.

The case where the distance L1 and the distance L2 are substantially equal as illustrated in FIG. 20 will be described below. In the case where the shrinkage ratio of the first bonding member 54 is lower than the shrinkage ratio of the second bonding member 55, the pulling force in the negative z-axis direction exerted on the substrate 32 due to the curing of the first bonding member 54 per unit volume is less than the pulling force in the positive z-axis direction exerted on the substrate 32 due to the curing of the second bonding member 55 per unit volume. Accordingly, in the case where the distance L1 and the distance L2 are equal, the area of the first bonding member 54 is set to be larger than the area of the second bonding member 55 as seen in the z-axis direction, as illustrated in FIGS. 21 and 22. Thus, the volume of the first bonding part is larger than the volume of the second bonding part, and the pulling force in the positive z-axis direction and the pulling force in the negative z-axis direction exerted on the substrate 32 approach equilibrium. Each volume can be determined so that the pulling force in the positive z-axis direction and the pulling force in the negative z-axis direction approach equilibrium. This can suppress misalignment of the substrate 32 and the image sensor 31 mounted on the substrate 32.

The first bonding member 54 and the second bonding member 55 may be in contact with the substrate side surface 32c of the substrate 32 in each of at least two regions (a region around the right end and a region around the left end in FIG. 18). In the manufacturing process, the first bonding member 54 and the second bonding member 55 applied to the substrate side surface 32c of the substrate 32 and the holding side surface 4c of the holding member 4 try to shrink with curing. Hence, a pulling force in a direction to the holding side surface 4c, i.e. a direction orthogonal to the optical axis OX direction, is exerted on the substrate 32. The first bonding member 54 and the second bonding member 55 are in contact with two or more substrate side surfaces 32c of the substrate 32. Therefore, pulling forces in two different directions are exerted on the substrate 32. Since the two different directions in which the substrate 32 is pulled have components in directions opposite to each other (for example, the positive x-axis direction and the negative x-axis direction), pulling forces in directions opposite to each other are exerted on the substrate 32. This can suppress misalignment of the substrate 32 and the image sensor 31 mounted on the substrate 32.

Figure 23:
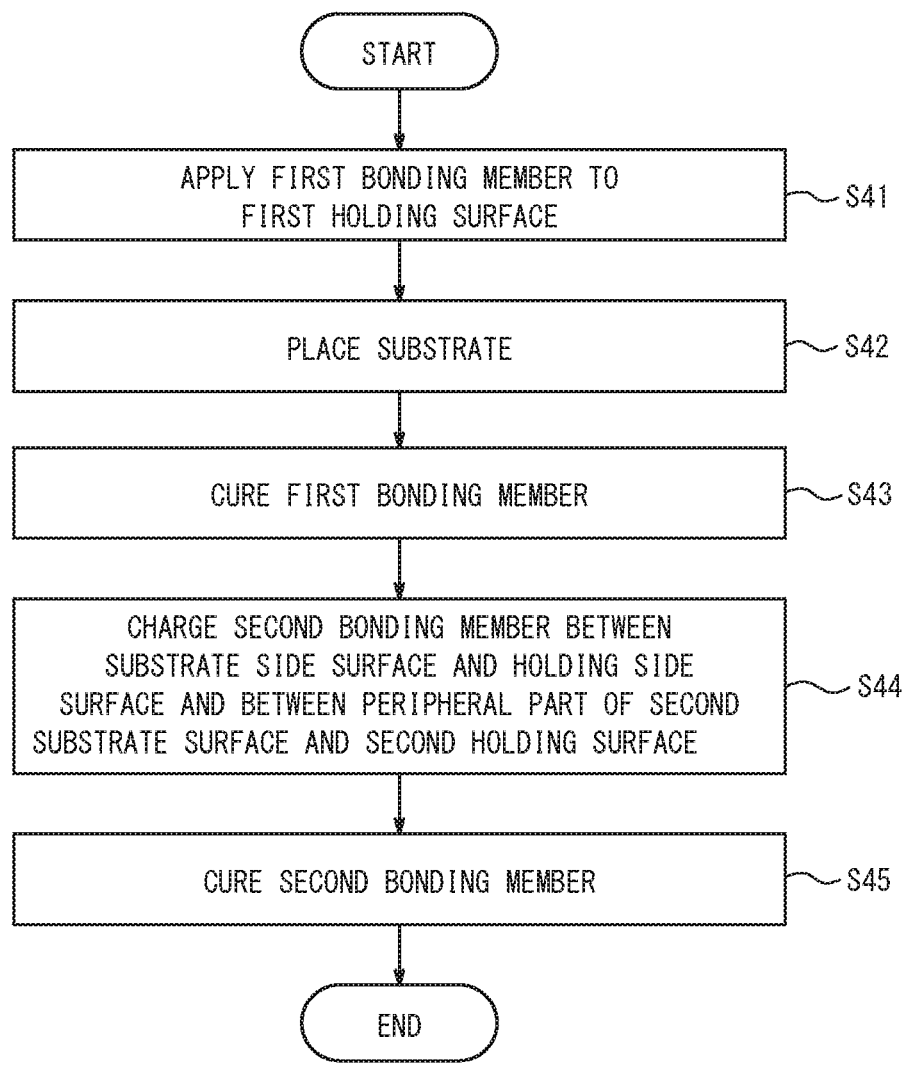
FIG. 23 is a flowchart illustrating an example of a manufacturing method for the imaging apparatus illustrated in FIG. 18.

The imaging apparatus 11 according to the sixth embodiment can be assembled by a manufacturing method in accordance with a procedure of the flowchart illustrated in FIG. 23.

First, the first bonding member 54 is applied to the first holding surface 4a (step S41). For example, the first bonding member 54 may be discretely applied to a plurality of (for example, four) regions in the first holding surface 4a corresponding to the peripheral part of the first substrate surface 32a, as illustrated in FIG. 19. The first bonding member 54 may be applied so as to continuously surround the region in the first holding surface 4a corresponding to the peripheral part of the first substrate surface 32a. As a result of the first bonding member 54 being applied continuously to the region corresponding to the peripheral part of the first substrate surface 32a, the substrate 32 can be firmly fixed to the holding member 4 as compared with the case where the first bonding member 54 is discretely applied.

Next, the substrate 32 is placed on the first holding surface 4a via the first bonding member 54 applied in step S41 (step S42). The position of the substrate 32 may be determined so that the center position of the image sensor 31 coincides with the optical axis OX of the imaging optical system 2. The position of the substrate 32 may be determined using a robotic arm or the like. Here, the first bonding member 54 may be in contact with at least a part of the substrate side surface 32c of the substrate 32.

Next, the first bonding member 54 applied in step S41 is cured (step S43). In the case where the first bonding member 54 is an ultraviolet curing adhesive, the first bonding member 54 is irradiated with ultraviolet light. This cures the first bonding member 54. In the case where the first bonding member 54 is made of another material, a process for curing the material may be performed.

Next, the second bonding member 55 is charged between the substrate side surface 32c and at least a part of the holding side surface 4c and between at least a part of the peripheral part of the second substrate surface 32b and the second holding surface 4b (step S44).

The second bonding member 55 applied or charged in step S44 is cured (step S45).

As described above, the first bonding member 54 and the second bonding member 55 are respectively in contact with the first substrate surface 32a and the second substrate surface 32b of the surface of the substrate 32. The first bonding member 54 and the second bonding member 55 are respectively in contact with the first holding surface 4a and the second holding surface 4b. The direction from the first substrate surface 32a to the first holding surface 4a and the direction from the second substrate surface 32b to the second holding surface 4b are different. Hence, pulling forces having components in directions opposite to each other are exerted on the substrate 32. This can suppress misalignment of the substrate 32 and the image sensor 31 mounted on the substrate 32, as compared with the conventional imaging apparatus 10 illustrated in FIG. 7 in which the bonding member 5 is in contact with only one planar surface of the substrate 32.

In the sixth embodiment, the volume of the first bonding part and the volume of the second bonding part may be determined depending on, for example, the shrinkage ratios or rigidity coefficients of the first bonding member 54 and the second bonding member 55. For example, the volume of the first bonding part may be larger than the volume of the second bonding part in the case where the shrinkage ratio of the first bonding member 54 is lower than the shrinkage ratio of the second bonding member 55. Thus, the substrate 32 and the image sensor 31 mounted on the substrate 32 can be arranged as designed, and their misalignment can be suppressed.

After the manufacture of the imaging apparatus 11 according to the sixth embodiment is completed, a temperature change in the ambient environment of the imaging apparatus 11 can cause the first bonding member 54 and the second bonding member 55 to try to shrink or expand due to rigidity. In this case, pulling forces in the direction to the first holding surface 4a and the direction to the second holding surface 4b, which are the opposite directions from the substrate 32, are exerted on the substrate 32, as described above. In the case where the first bonding member 54 and the second bonding member 55 try to expand, pressing forces from the first holding surface 4a side and the second holding surface 4b side, which are the opposite sides of the substrate 32, are exerted on the substrate 32, as described above. This can suppress misalignment of the substrate 32 and the image sensor 31 mounted on the substrate 32.

In the imaging apparatus 11 according to the sixth embodiment, the second bonding member 55 may be in contact with the image sensor 31, instead of the substrate 32.

For example, the second bonding member 55 may be in contact with a part of the surface of the image sensor 31 facing the imaging optical system 2 and the second holding surface 4b. In this case, the first bonding member 54 is in contact with the first substrate surface 32a and the first holding surface 4a. Thus, when the first bonding member 54 and the second bonding member 55 try to shrink, pulling forces in the negative z-axis direction and the positive z-axis direction are exerted on the substrate 32 and the image sensor 31. This can suppress misalignment of the substrate 32 and the image sensor 31 as compared with the case where the bonding member 5 is in contact with only the first substrate surface 32a, as described above. The second bonding member 55 may be in contact with both the substrate 32 and the image sensor 31.

For example, the second bonding member 55 may be in contact with the edge of the image sensor 31. In this case, the second bonding member 55 is in contact with the holding side surface 4c facing the edge of the image sensor 31. In the case where the surface of the image sensor 31 in the part in contact with the second bonding member 55 faces different directions at at least two positions having components in directions opposite to each other, pulling forces in different directions having components in directions opposite to each other are exerted on the image sensor 31. This can suppress misalignment of the image sensor 31 and the substrate 32. The second bonding member 55 may be in contact with both the substrate 32 and the edge of the image sensor 31.

Although the above describes the case where the surface of the substrate 32 is made up of planar surfaces in the imaging apparatus 11 according to the sixth embodiment, the surface of the substrate 32 may have curvature. In this case, pulling forces having components in directions opposite to each other are exerted on the substrate portion 3 which integrates the image sensor 31 and the substrate 32. This can suppress misalignment of the substrate 32 and the image sensor 31.

Although the first bonding member 54 is cured before the second bonding member 55 is charged and applied in the manufacturing method for the imaging apparatus 11 according to the sixth embodiment, the manufacturing method is not limited to such. One example is that, after the substrate 32 is placed in step S42, the second bonding member 55 is charged, and then the first bonding member 54 and the second bonding member 55 are cured.

An imaging apparatus 16 according to a seventh embodiment will be described in detail below.

Figure 24:
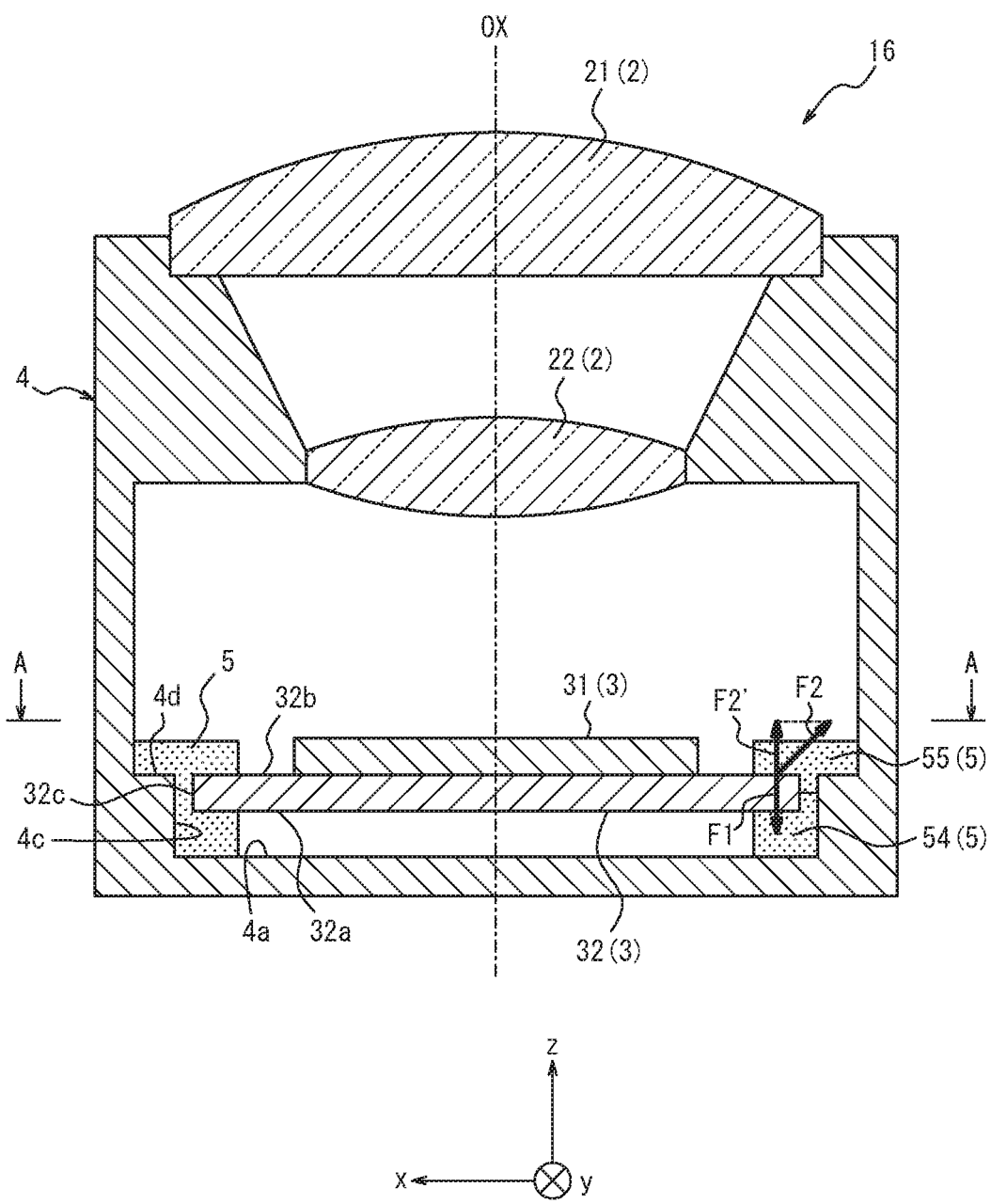
FIG. 24 is a cross-sectional view illustrating an example of a structure of an imaging apparatus according to a seventh embodiment.

As illustrated in FIGS. 24 and 25, the imaging apparatus 16 according to the seventh embodiment includes an imaging optical system 2, a substrate portion 3, a holding member 4, and a bonding member 5. The substrate portion 3 includes an image sensor 31 and a substrate 32. Only the differences of the seventh embodiment from the sixth embodiment will be described below. In the seventh embodiment, description of the same structures as those in the sixth embodiment is omitted.

In the seventh embodiment, the holding member 4 has, as a first holding contact portion, a first holding surface 4a facing at least a part of the first substrate surface 32a of the substrate 32, on the side of the substrate 32 opposite to the imaging optical system 2. The holding member 4 also has, as a second holding contact portion, a third holding surface 4d (fifth surface) facing the facing direction of the second substrate surface 32b, on the imaging optical system 2 side of the substrate 32.

The first bonding member 54 may be in contact with a first substrate contact portion of the substrate 32 and the first holding contact portion of the holding member 4. Specifically, the first bonding member 54 may be in contact with the first substrate surface 32a as the first substrate contact portion and the first holding surface 4a as the first holding contact portion. The second bonding member 55 may be in contact with a second substrate contact portion of the substrate 32 and the second holding contact portion of the holding member 4. Specifically, the second bonding member 55 may be in contact with the second substrate surface 32b as the second substrate contact portion and the third holding surface 4d as the second holding contact portion. The first bonding member 54 or the second bonding member 55 may be in contact with the substrate side surface 32c of the substrate 32, as in the sixth embodiment.

As illustrated in FIG. 24, the second bonding member 55 is in contact with the third holding surface 4d in a region displaced in the x-axis direction from the region where the second bonding part 52 is in contact with the second substrate surface 32b of the substrate 32. Accordingly, when the second bonding member 55 tries to shrink with curing, a pulling force F2 in a direction between the x-axis direction and the positive z-axis direction is exerted on the substrate 32. Consequently, a component F2' in the positive z-axis direction of the force F2 is exerted on the substrate 32. The magnitude of the force F2' is determined depending on the shrinkage ratio and shape of the second bonding member 55, the position and direction of the third holding surface 4d, and the like. Meanwhile, the first bonding member 54 is in contact with the first holding surface 4a facing the first substrate surface 32a of the substrate 32. Accordingly, when the first bonding member 54 tries to shrink with curing, a pulling force F1 in the negative z-axis direction depending on the shrinkage ratio of the first bonding member 54 is exerted on the substrate 32.

The first bonding member 54 and the second bonding member 55 may therefore be applied so that the force F1 and the force F2' approach equilibrium. This can further suppress misalignment of the substrate 32 and the image sensor 31 mounted on the substrate 32.

Figure 26:
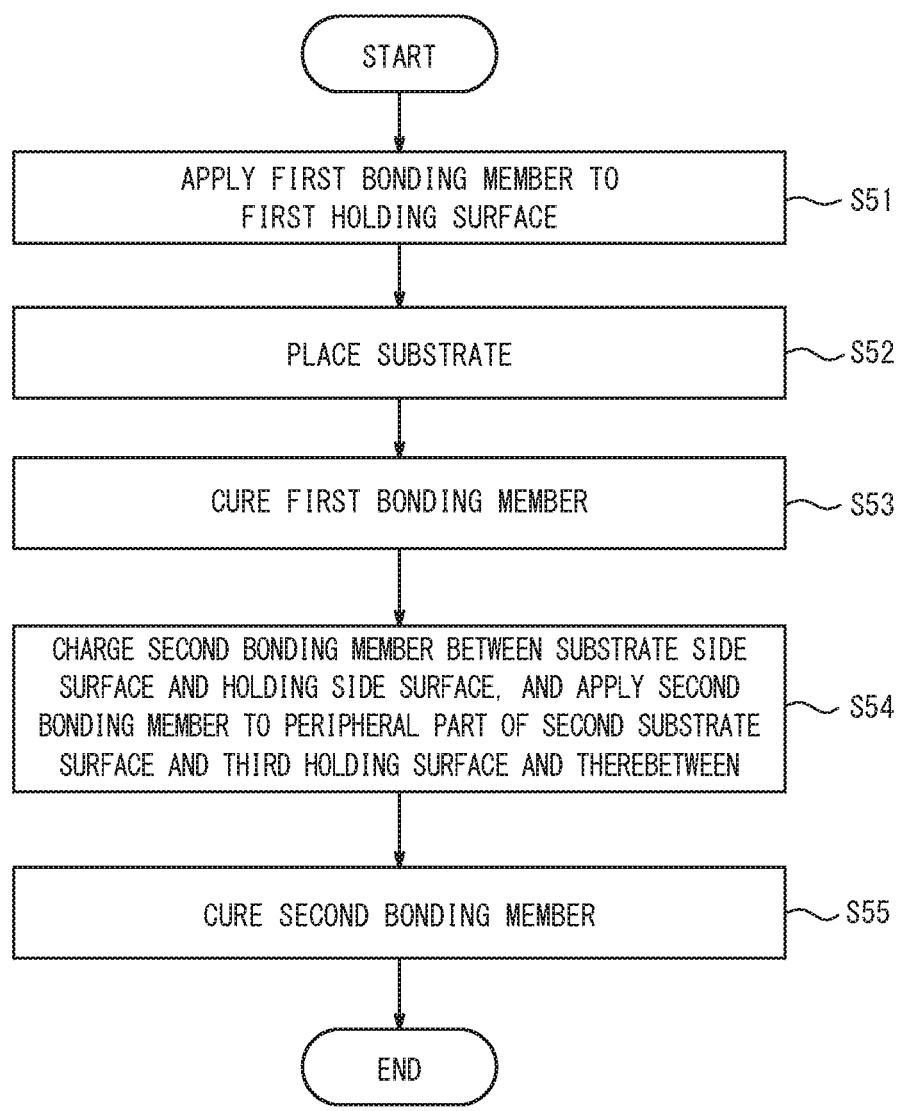
FIG. 26 is a flowchart illustrating an example of a manufacturing method for the imaging apparatus illustrated in FIG. 24.

The imaging apparatus 16 according to the seventh embodiment can be assembled by a manufacturing method in accordance with a procedure of the flowchart illustrated in FIG. 26.

First, the first bonding member 54 is applied to the first holding surface 4a of the holding member 4 (step S51).

Next, the substrate 32 is placed on the first holding surface 4a of the holding member 4 via the first bonding member 54 applied in step S51 (step S52). The first bonding member 54 may be in contact with at least a part of the substrate side surface 32c of the substrate 32.

Next, the first bonding member 54 applied in step S51 is cured (step S53).

Next, the second bonding member 55 is charged between the substrate side surface 32c and at least a part of the holding side surface 4c, and applied to at least a part of the peripheral part of the second substrate surface 32b and the third holding surface 4d and therebetween (step S54).

Next, the second bonding member 55 applied in step S54 is cured (step S55).

As described above, in the seventh embodiment, the holding member 4 has the first holding surface 4a facing at least a part of the first substrate surface 32a of the substrate 32, on the side of the substrate 32 opposite to the imaging optical system 2. The holding member 4 also has the third holding surface 4d facing the facing direction of the second substrate surface 32b, on the imaging optical system 2 side of the substrate 32. Accordingly, when the first bonding member 54 applied to the first substrate surface 32a of the substrate 32 and the first holding surface 4a of the holding member 4 tries to shrink with curing in the manufacturing process, a pulling force in the negative z-axis direction is exerted on the substrate 32. When the second bonding member 55 applied to the second substrate surface 32b of the substrate 32 and the third holding surface 4d of the holding member 4 tries to shrink with curing in the manufacturing process, a pulling force having a component in the positive z-axis direction is exerted on the substrate 32. This can suppress misalignment of the substrate 32 and the image sensor 31 mounted on the substrate 32.

After the manufacture of the imaging apparatus 16 according to the seventh embodiment is completed, a temperature change in the ambient environment of the imaging apparatus 16 can cause the first bonding member 54 and the second bonding member 55 to try to shrink or expand due to rigidity. In this case, misalignment of the substrate 32 and the image sensor 31 mounted on the substrate 32 can be suppressed, as in the sixth embodiment.

In the imaging apparatus 16 according to the seventh embodiment, the second bonding member 55 may be in contact with the image sensor 31. In this case, the image sensor 31 is fixed to the holding member 4 via the second bonding member 55. Hence, the substrate 32 having the image sensor 31 mounted thereon is fixed to the holding member 4. This can suppress misalignment of the substrate 32 and the image sensor 31, as described above.

Although the first bonding member 54 is cured before the second bonding member 55 is charged and applied in the manufacturing method for the imaging apparatus 16 according to the seventh embodiment, the manufacturing method is not limited to such. One example is that, after the substrate 32 is placed in step S52, the second bonding member 55 is charged and applied, and then the first bonding member 54 and the second bonding member 55 are cured.

An imaging apparatus 17 according to an eighth embodiment will be described in detail below.

Figure 27:
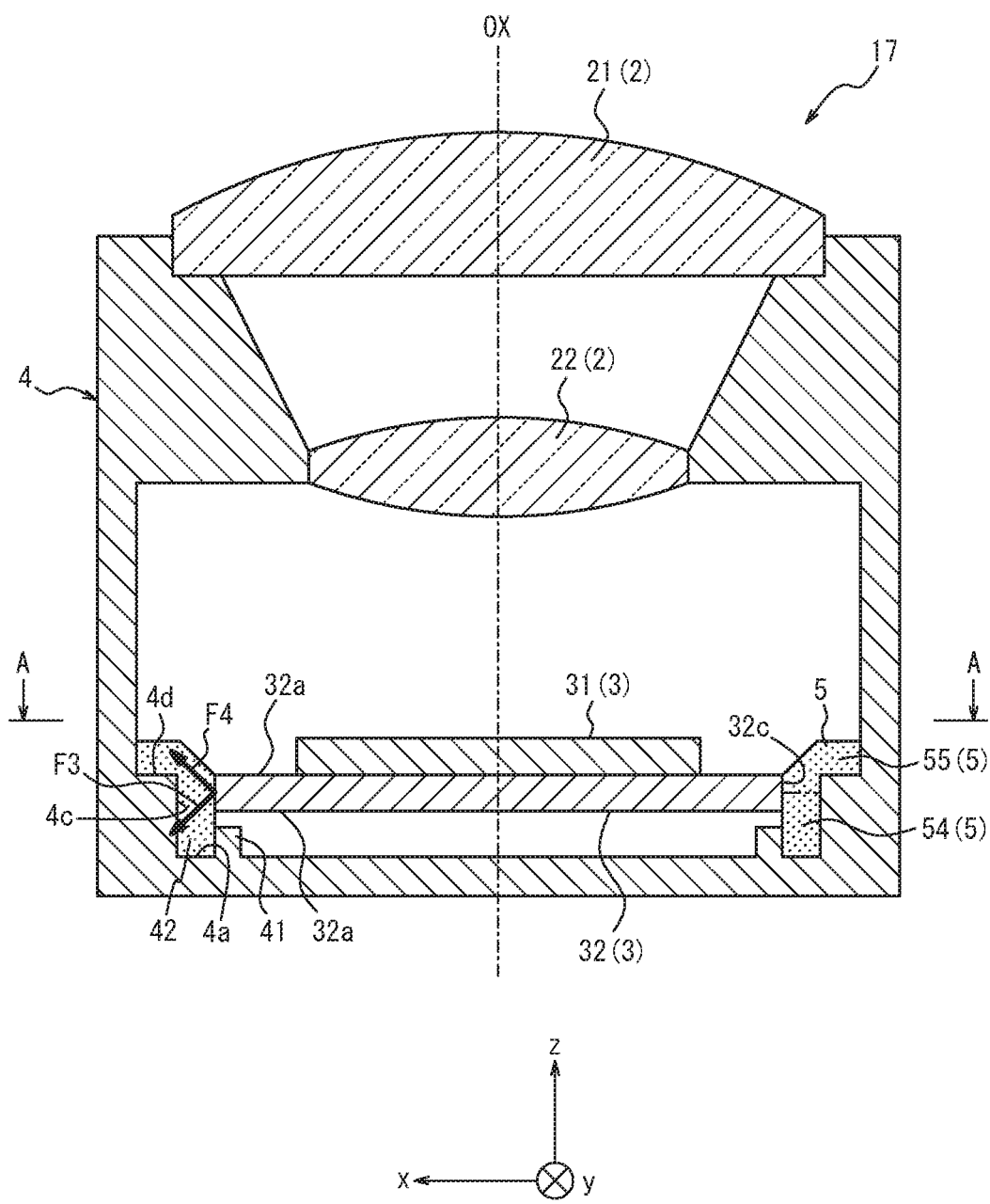
FIG. 27 is a cross-sectional view illustrating an example of a structure of an imaging apparatus according to an eighth embodiment.
Figure 28:
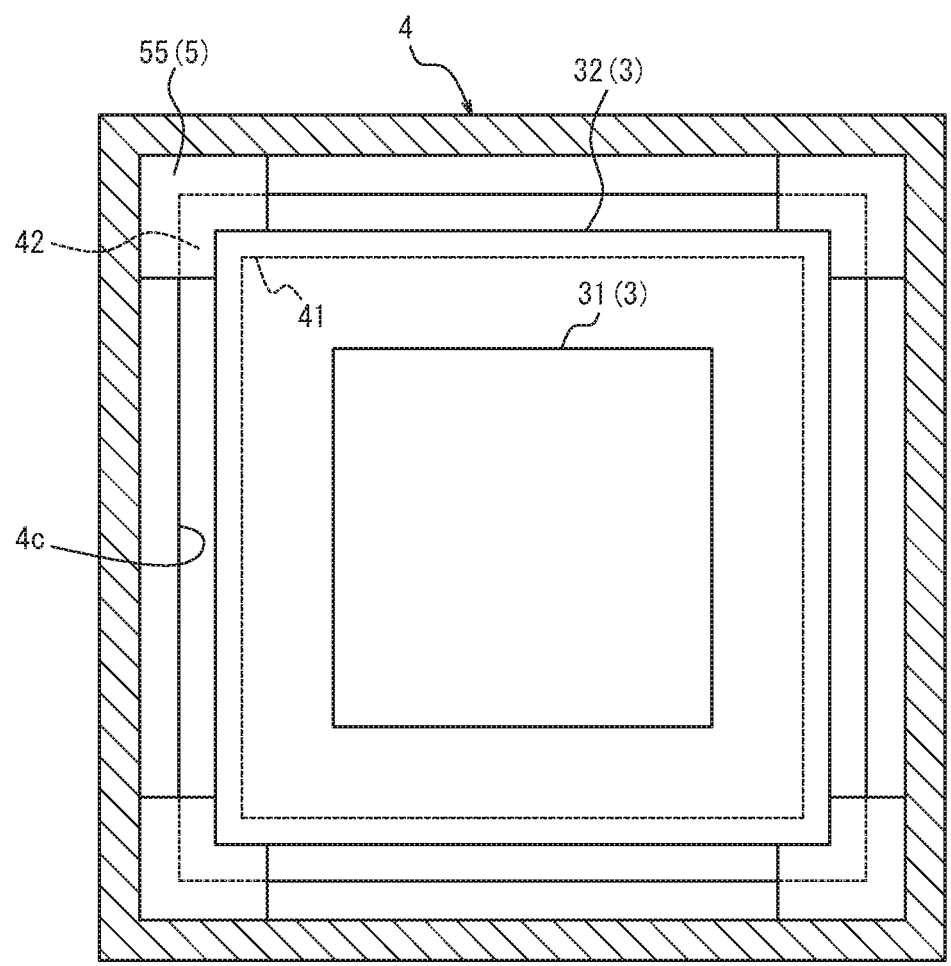
FIG. 28 is an example of a cross section along A-A in FIG. 27.

As illustrated in FIGS. 27 and 28, the imaging apparatus 17 according to the eighth embodiment includes an imaging optical system 2, a substrate portion 3, a holding member 4, and a bonding member 5. The substrate portion 3 includes an image sensor 31 and a substrate 32. The holding member 4 has a first holding surface 4a, a third holding surface 4d, and a holding side surface 4c. Only the differences of the eighth embodiment from the seventh embodiment will be described below. In the eighth embodiment, description of the same structures as those in the seventh embodiment is omitted.

The holding member 4 may have a groove wall portion 41. The groove wall portion 41 may be fixed to the first holding surface 4a. The groove wall portion 41 may be integral with the first holding surface 4a. The groove wall portion 41 defines a groove 42 together with the holding side surface 4c of the holding member 4. The groove 42 is located to prevent the first bonding member 54 applied to the substrate side surface 32c, the first holding surface 4a, and a part of the holding side surface 4c from adhering to the first substrate surface 32a of the substrate 32. For example, the groove 42 is at the edge of the substrate 32 or outside the substrate 32 in the x-axis direction.

The first bonding member 54 and the second bonding member 55 are each in contact with at least a part of the substrate side surface 32c. The first bonding member 54 and the second bonding member 55 are each not in contact with the first substrate surface 32a and the second substrate surface 32b. The first bonding member 54, as a result of being charged into the groove 42, is in contact with a region of the first holding surface 4a of the holding member 4 not facing the substrate 32. The second bonding member 55 is in contact with the third holding surface 4d of the holding member 4, the groove 42, and the holding side surface 4c.

The first bonding member 54 and the second bonding member 55 are in contact with the substrate side surface 32c of the substrate 32 in each of at least two regions (for example, a region around the right end and a region around the left end in FIG. 27). The first bonding member 54 and the second bonding member 55 in contact with the substrate side surface 32c may be in contact with different regions of the holding side surface 4c of the holding member 4.

Figure 29:
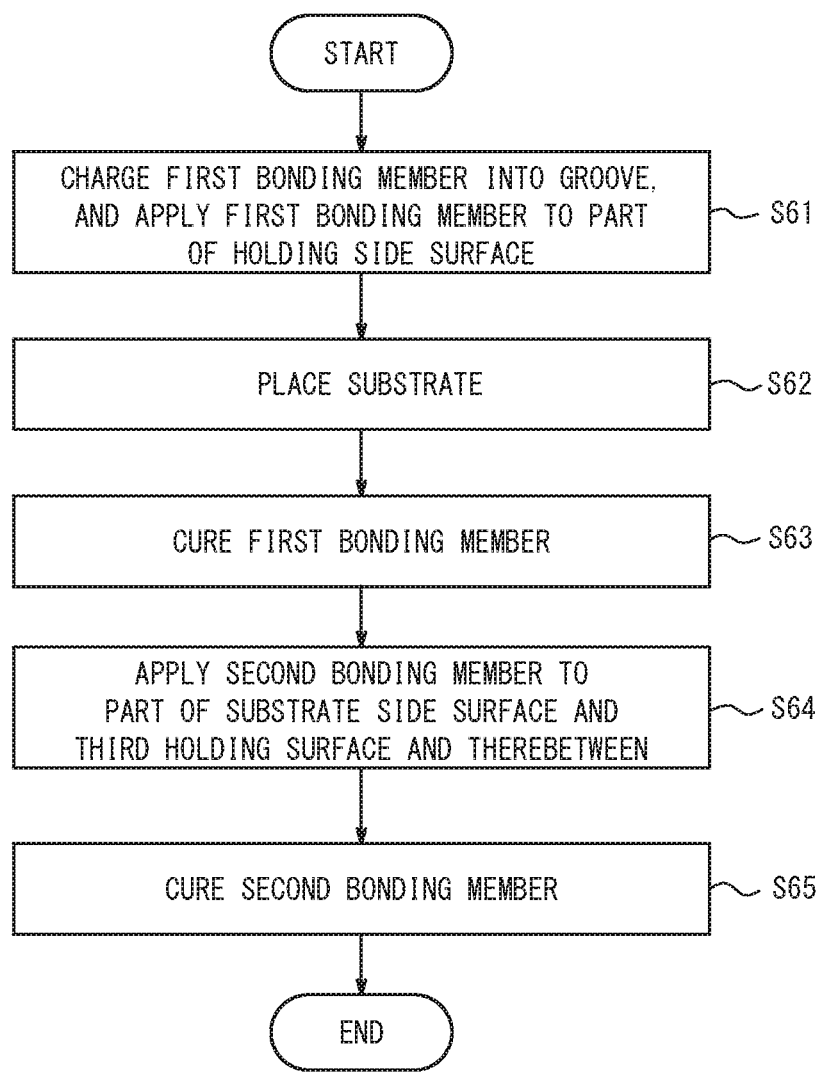
FIG. 29 is a flowchart illustrating an example of a manufacturing method for the imaging apparatus illustrated in FIG. 27.

The imaging apparatus 17 according to the eighth embodiment can be assembled by a manufacturing method in accordance with a procedure of the flowchart illustrated in FIG. 29.

First, the first bonding member 54 is charged into the groove 42, and applied to a part of the holding side surface 4c (step S61).

Next, the substrate 32 is placed so that the substrate side surface 32c is in contact with the first bonding member 54 applied to the part of the holding side surface 4c in step S61 (step S62).

Next, the first bonding member 54 applied or charged in step S61 is cured (step S63).

Next, the second bonding member 55 is applied to a part of the substrate side surface 32c of the substrate 32 and the third holding surface 4d and therebetween (step S64).

Next, the second bonding member 55 applied in step S64 is cured (step S65).

As described above, in the eighth embodiment, the first bonding member 54 is in contact with the substrate side surface 32c and the region of the first holding surface 4a not facing the first substrate surface 32a. In the manufacturing process, the first bonding member 54 applied to the first holding surface 4a and the substrate side surface 32c tries to shrink with curing. Hence, a pulling force F3 in a direction from the substrate side surface 32c toward the first holding surface 4a is exerted on the substrate 32. Further, the second bonding member 55 is in contact with the third holding surface 4d. In the manufacturing process, the second bonding member 55 applied to the third holding surface 4d and the substrate side surface 32c tries to shrink with curing. Hence, a pulling force F4 in a direction from the substrate side surface 32c toward the third holding surface 4d of the holding member 4 is exerted on the substrate 32.

The substrate 32 is thus pulled by each of the component in the negative z-axis direction of the force F3 and the component in the positive z-axis direction of the force F4, in the optical axis OX direction. This can suppress misalignment of the substrate 32 and the image sensor 31 mounted on the substrate 32, as compared with the imaging apparatus 10 according to the comparative example in FIG. 7 in which the bonding member 5 is in contact with only the first holding surface 4a of the holding member 4.

In the eighth embodiment, the first holding surface 4a of the holding member 4 has the groove 42. Hence, when the first bonding member 54 is applied to the first holding surface 4a in the manufacturing process, the first bonding member 54 is kept from flowing between the first substrate surface 32a of the substrate 32 and the first holding surface 4a of the holding member 4. Since the first bonding member 54 is not applied to the first substrate surface 32a, misalignment of the substrate 32 in the negative z-axis direction due to the shrinkage of the first bonding member 54 can be suppressed.

In the eighth embodiment, the first bonding member 54 and the second bonding member 55 may be applied depending on the shrinkage ratios or rigidity coefficients of the first bonding member 54 and the second bonding member 55, as in the seventh embodiment. The first bonding member 54 and the second bonding member 55 may be applied depending on the position and direction of the holding member 4 in contact with the first bonding member 54 and the second bonding member 55, the area of the holding member 4 in contact with the first bonding member 54 and the second bonding member 55, and the like.

In the eighth embodiment, in the manufacturing process, the first bonding member 54 and the second bonding member 55 applied to the substrate side surface 32c of the substrate 32 and the holding side surface 4c of the holding member 4 try to shrink with curing. Hence, a pulling force in a direction to the holding side surface 4c, i.e. a direction orthogonal to the optical axis OX direction, is exerted on the substrate 32. The first bonding member 54 and the second bonding member 55 are in contact with two or more substrate side surfaces 32c of the substrate 32. Therefore, pulling forces in two different directions are exerted on the substrate 32. Since the two different directions in which the substrate 32 is pulled have components in directions opposite to each other (for example, the positive x-axis direction and the negative x-axis direction), pulling forces in directions opposite to each other are exerted on the substrate 32. This can suppress misalignment of the substrate 32 and the image sensor 31 mounted on the substrate 32 in a direction perpendicular to the optical axis OX direction.

After the manufacture of the imaging apparatus 17 according to the eighth embodiment is completed, a temperature change in the ambient environment of the imaging apparatus 17 can cause the first bonding member 54 and the second bonding member 55 to try to shrink or expand due to rigidity. In this case, misalignment of the substrate 32 and the image sensor 31 mounted on the substrate 32 can be suppressed, as in the sixth embodiment.

In the eighth embodiment, the second bonding member 55 may be in contact with the image sensor 31. In this case, the image sensor 31 is fixed to the holding member 4 via the second bonding member 55. Hence, the substrate 32 having the image sensor 31 mounted thereon is fixed to the holding member 4. This can suppress misalignment of the substrate 32 and the image sensor 31, as in the sixth embodiment.

Although the first bonding member 54 and the second bonding member 55 are in contact with the substrate side surface 32c of the substrate 32 in each of at least two regions (a region around the right end and a region around the left end in FIG. 27), this is not a limitation. One example is that the first bonding member 54 is in contact with the substrate side surface 32c of the substrate 32 in one region and the second bonding member 55 is in contact with the substrate side surface 32c of the substrate 32 in another region. In this case, the first bonding member 54 and the second bonding member 55 may be determined as appropriate depending on the position and direction of the holding member 4, the shrinkage ratios or rigidities of the first bonding member 54 and the second bonding member 55, and the like.

An imaging apparatus 18 according to a ninth embodiment will be described in detail below.

Figure 30:
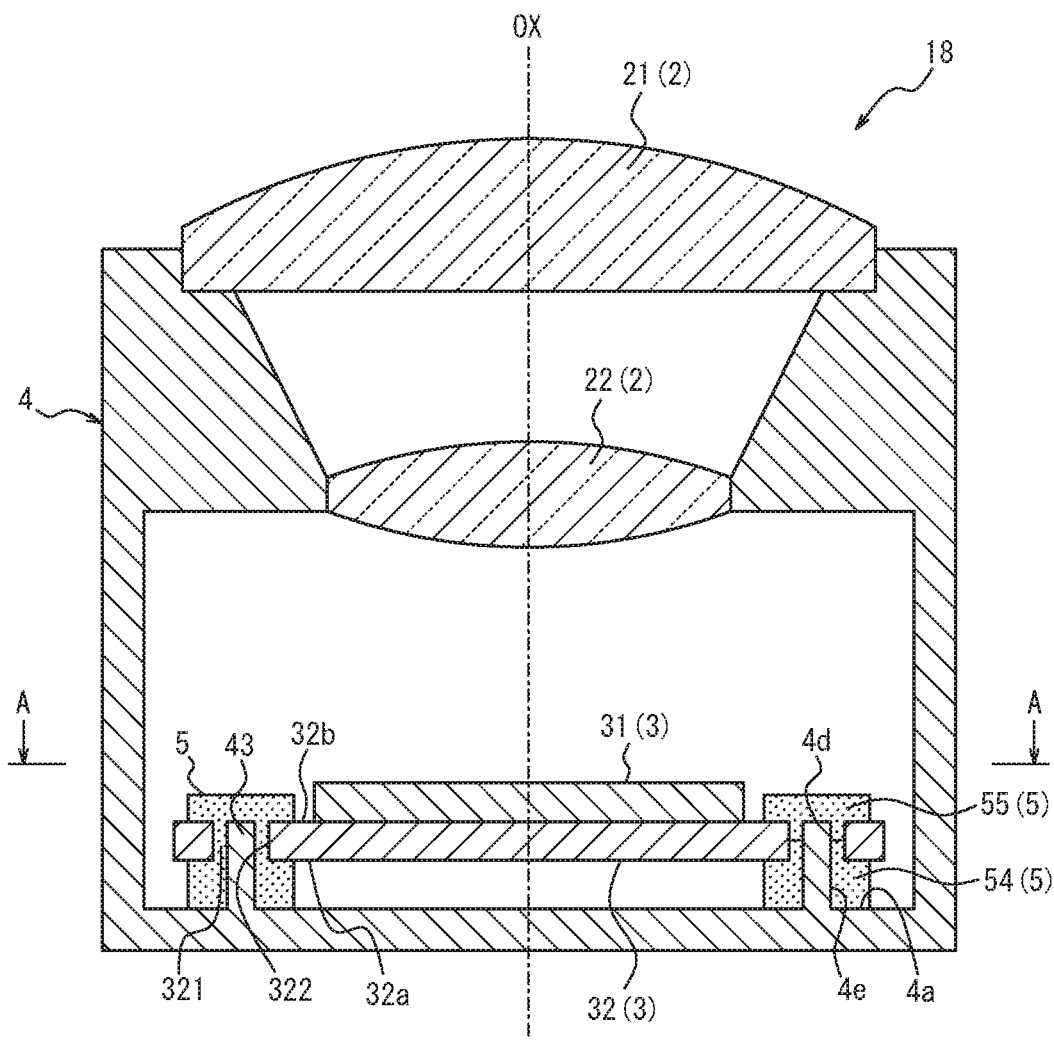
FIG. 30 is a cross-sectional view illustrating an example of a structure of an imaging apparatus according to a ninth embodiment.
Figure 31:
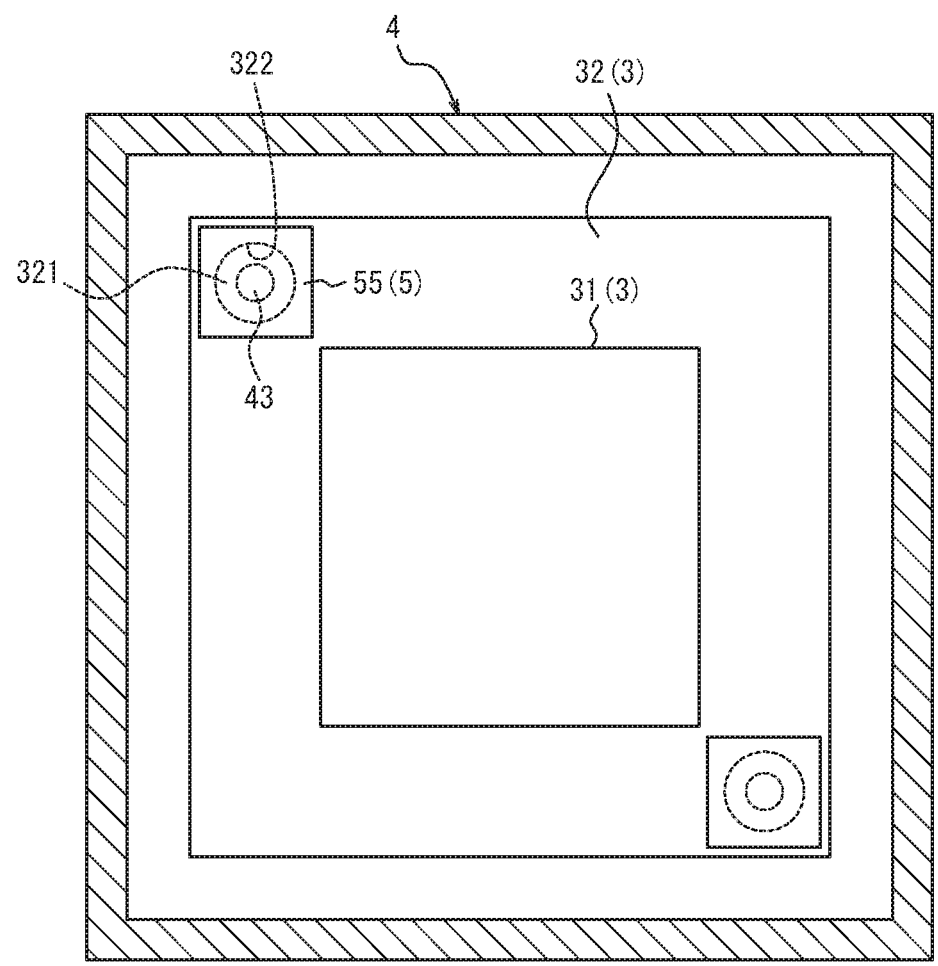
FIG. 31 is an example of a cross section along A-A in FIG. 30.

As illustrated in FIGS. 30 and 31, the imaging apparatus 18 according to the ninth embodiment includes an imaging optical system 2, a substrate portion 3, a holding member 4, and a bonding member 5. The substrate portion 3 includes an image sensor 31 and a substrate 32. Only the differences of the ninth embodiment from the seventh embodiment will be described below. In the ninth embodiment, description of the same structures as those in the seventh embodiment is omitted.

In the ninth embodiment, the substrate 32 has a hole wall 322 defining at least one through hole 321. The length of the through hole 321 in a direction perpendicular to the through direction of the through hole 321 is determined based on the relationships among the substrate 32, the image sensor 31, and the below-described projection 43 of the holding member 4. The through hole 321 may be circular as seen in the z-axis direction. The through hole 321 may have any shape such as elliptical, quadrangular, or triangular as seen in the z-axis direction.

The holding member 4 has the projection 43 that at least partly extends into the through hole 321, in a part corresponding to the through hole 321. The length of the projection 43 in a direction perpendicular to the optical axis OX is at least shorter than the corresponding length of the through hole 321. The projection 43 may be circular as seen in the z-axis direction. The projection 43 may have any shape such as elliptical, quadrangular, or triangular as seen in the z-axis direction.

The holding member 4 has a first holding surface 4a facing the first substrate surface 32a. The projection 43 has a third holding surface 4d facing the facing direction of the second substrate surface 32b of the substrate 32, on the imaging optical system 2 side of the substrate 32. The projection 43 has a projection side surface 4e facing the hole wall 322.

The first bonding member 54 and the second bonding member 55 are in contact with the substrate 32 at the inner periphery of the through hole 321 and in the regions of both surfaces, between which the through hole 321 is interposed, around the through hole 321, and are in contact with the holding member 4 at and around the projection 43. Specifically, the first bonding member 54 is in contact with the first substrate surface 32a and the first holding surface 4a. The second bonding member 55 is in contact with the peripheral part of the second substrate surface 32b and the third holding surface 4d. The first bonding member 54 and the second bonding member 55 may be in contact with at least a part of each of the hole wall 322 and the projection side surface 4e.

The imaging apparatus 18 according to the ninth embodiment can be assembled by the same manufacturing method as the manufacturing method according to the seventh embodiment illustrated in FIG. 26, except the following: In the manufacturing method according to the ninth embodiment, in step S54, the second bonding member 55 is charged not between the substrate side surface 32c and the holding side surface 4c but between the hole wall 322 and the projection side surface 4e. In step S54, the second bonding member 55 is applied not to the peripheral part of the second substrate surface 32b and the third holding surface 4d and therebetween, but to the second substrate surface 32b around the hole wall 322 and the third holding surface 4d and therebetween.

As described above, misalignment of the substrate 32 and the image sensor 31 mounted on the substrate 32 can be suppressed in the imaging apparatus 18 according to the ninth embodiment, for the same reasons as in the imaging apparatus 16 according to the seventh embodiment.

In the ninth embodiment, the first bonding member 54 and the second bonding member 55 may be applied depending on the shrinkage ratios or rigidity coefficients of the first bonding member 54 and the second bonding member 55, as in the seventh embodiment. The first bonding member 54 and the second bonding member 55 may be applied depending on the position and direction of the holding member 4 in contact with the first bonding member 54 and the second bonding member 55, the area of the holding member 4 in contact with the first bonding member 54 and the second bonding member 55, and the like.

After the manufacture of the imaging apparatus 18 according to the ninth embodiment is completed, a temperature change in the ambient environment of the imaging apparatus 18 can cause the bonding member 5 to try to shrink or expand due to rigidity. In this case, misalignment of the substrate 32 and the image sensor 31 mounted on the substrate 32 can be suppressed, as in the sixth embodiment.

In the imaging apparatus 18 according to the ninth embodiment, the second bonding member 55 may be in contact with the image sensor 31. In this case, the image sensor 31 is fixed to the holding member 4 via the second bonding member 55. Hence, the substrate 32 having the image sensor 31 mounted thereon is fixed to the holding member 4. This can suppress misalignment of the substrate 32 and the image sensor 31, as in the sixth embodiment.

An imaging apparatus 19 according to a tenth embodiment will be described in detail below.

Figure 32:
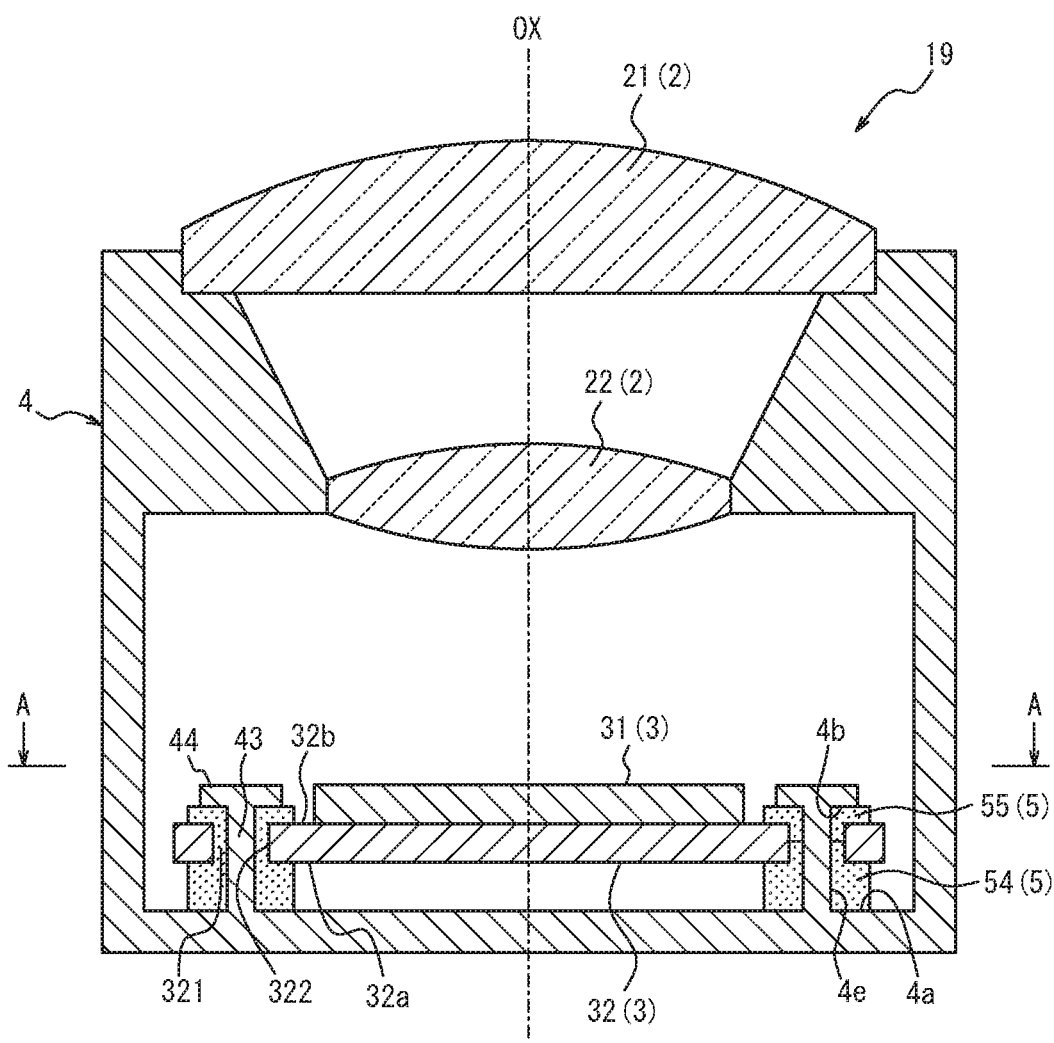
FIG. 32 is a cross-sectional view illustrating an example of a structure of an imaging apparatus according to a tenth embodiment.
Figure 33:
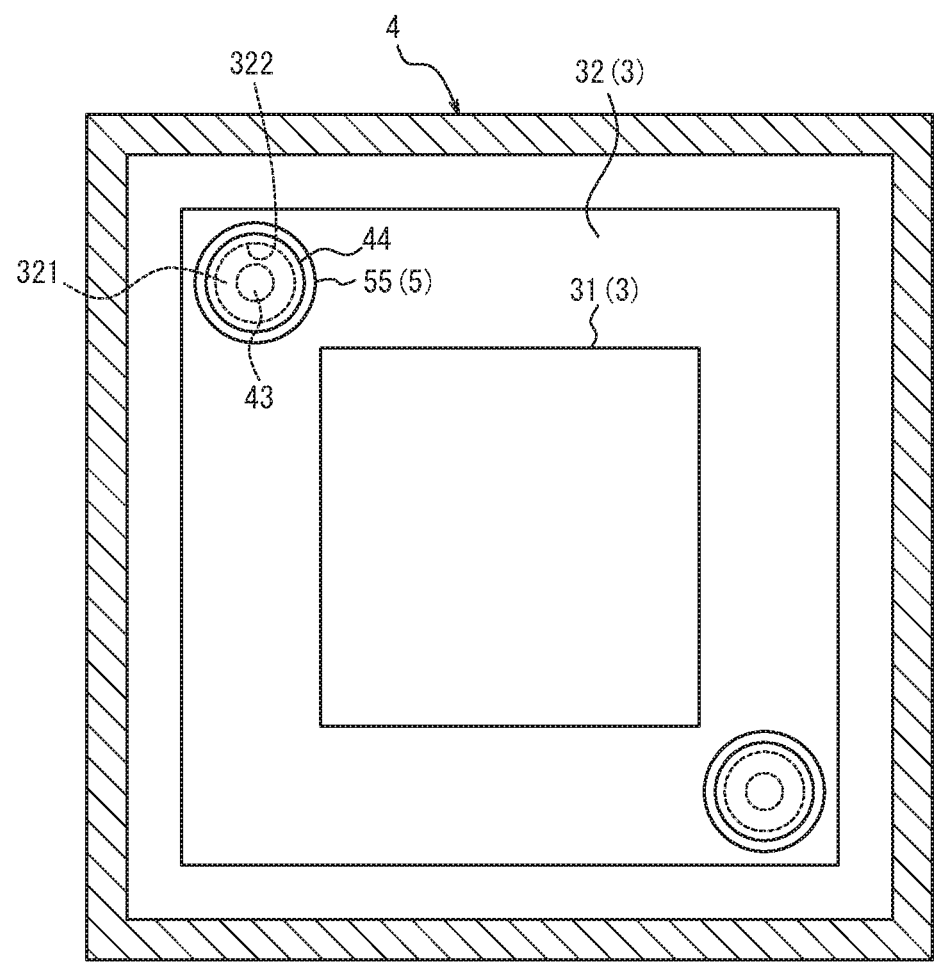
FIG. 33 is an example of a cross section along A-A in FIG. 32.

As illustrated in FIGS. 32 and 33, the imaging apparatus 19 according to the tenth embodiment includes an imaging optical system 2, a substrate portion 3, a holding member 4, and a bonding member 5. The substrate portion 3 includes an image sensor 31 and a substrate 32. The substrate 32 has a hole wall 322 defining at least one through hole 321. Only the differences of the tenth embodiment from the ninth embodiment will be described below. In the tenth embodiment, description of the same structures as those in the ninth embodiment is omitted.

The holding member 4 has a projection 43 passing through the through hole 321. The holding member 4 has an overhang 44 that overhangs from the tip of the projection 43 in a direction along the substrate 32. The overhang 44 may be integral with the projection 43. The overhang 44 may be fixed to the projection 43.

The first bonding member 54 and the second bonding member 55 are in contact with the substrate 32 at the inner periphery of the through hole 321 and in the regions of both surfaces, between which the through hole 321 is interposed, around the through hole 321, and are in contact with the holding member 4 at and around the projection 43, as in the ninth embodiment. Specifically, the first bonding member 54 may be in contact with the first substrate surface 32a and the first holding surface 4a. The second bonding member 55 may be in contact with the peripheral part of the through hole 321 in the second substrate surface 32b and the second holding surface 4b. The first bonding member 54 and the second bonding member 55 may be in contact with at least a part of each of the hole wall 322 and the projection side surface 4e.

The imaging apparatus 19 according to the tenth embodiment can be assembled by the same manufacturing method as the manufacturing method according to the sixth embodiment illustrated in FIG. 23, except the following: In the manufacturing method according to the tenth embodiment, in step S44, the second bonding member 55 is charged not between the substrate side surface 32c and the holding side surface 4c but between the hole wall 322 and the projection side surface 4e.

As described above, misalignment of the substrate 32 and the image sensor 31 mounted on the substrate 32 can be suppressed in the imaging apparatus 19 according to the tenth embodiment, for the same reasons as in the imaging apparatus 11 according to the sixth embodiment.

In the tenth embodiment, the volume of the first bonding member 54 and the volume of the second bonding member 55 may be determined depending on, for example, the shrinkage ratios or rigidity coefficients of the first bonding member 54 and the second bonding member 55, as in the sixth embodiment. For example, the volume of the first bonding member 54 may be larger than the volume of the second bonding member 55 in the case where the shrinkage ratio of the first bonding member 54 is lower than the shrinkage ratio of the second bonding member 55.

After the manufacture of the imaging apparatus 19 according to the tenth embodiment is completed, a temperature change in the ambient environment of the imaging apparatus 19 can cause the bonding member 5 to try to shrink or expand due to rigidity. In this case, misalignment of the substrate 32 and the image sensor 31 mounted on the substrate 32 can be suppressed, as in the sixth embodiment.

In the imaging apparatus 19 according to the tenth embodiment, the second bonding member 55 may be in contact with the image sensor 31. In this case, the image sensor 31 is fixed to the holding member 4 via the second bonding member 55. Hence, the substrate 32 having the image sensor 31 mounted thereon is fixed to the holding member 4. This can suppress misalignment of the substrate 32 and the image sensor 31, as in the sixth embodiment.

The imaging apparatuses 1, 6 to 9, 11, and 16 to 19 according to the present disclosure may each be mounted on a mobile object. Examples of the "mobile object" in the present disclosure include vehicles, ships, and aircraft. The "vehicles" in the present disclosure include, but are not limited to, motor vehicles, industrial vehicles, railed vehicles, domestic vehicles, and fixed-wing airplanes running on runways. Motor vehicles include, but are not limited to, cars, trucks, buses, two-wheeled vehicles, trolleybuses, and other vehicles running on roads. Industrial vehicles include industrial vehicles for agriculture and construction. Industrial vehicles include, but are not limited to, forklifts and golf carts. Industrial vehicles for agriculture include, but are not limited to, tractors, cultivators, transplanters, binders, combines, and lawn mowers. Industrial vehicles for construction include, but are not limited to, bulldozers, scrapers, power shovels, crane trucks, dump trucks, and road rollers. Vehicles include human-powered vehicles. The classifications of vehicles are not limited to the above-mentioned examples. For example, motor vehicles may include industrial vehicles that can run on roads. The same type of vehicle may belong to a plurality of classifications. The "ships" in the present disclosure include personal watercraft, boats, and tankers. The "aircraft" in the present disclosure includes fixed-wing airplanes and rotary-wing airplanes.

The drawings referred to in the embodiments of the present disclosure are schematic, and the dimensional ratios and the like in the drawings do not necessarily correspond to the actual dimensional ratios and the like.

Although the embodiments of the present disclosure have been described by way of the drawings and examples, various changes or modifications may be easily made by those of ordinary skill in the art based on the present disclosure. Such various changes or modifications are therefore included in the scope of the present disclosure. For example, the functions included in the components, steps, etc. may be rearranged without logical inconsistency, and a plurality of components, steps, etc. may be combined into one component, step, etc. and a component, step, etc. may be divided into a plurality of components, steps, etc. Although apparatuses have been mainly described in the embodiments of the present disclosure, the embodiments of the present disclosure can also be implemented as methods including the steps executed by the components included in the apparatuses. The embodiments of the present disclosure can also be implemented as methods or programs executed by processors included in the apparatuses or storage media storing such programs, which are also included in the scope of the present disclosure.

Terms such as "first", "second", "third", and "fourth" in the present disclosure are identifiers for distinguishing components. Components distinguished by terms such as "first", "second", "third", and "fourth" in the present disclosure may have their numbers interchanged with each other. For example, the identifier "first" and the identifier "second" may be interchanged with each other. The identifiers are replaced with each other simultaneously. The components are distinguishable even after their identifiers are interchanged. The identifiers may be omitted. Components from which identifiers are omitted are distinguished by reference signs. Description of identifiers such as "first" and "second" in the present disclosure alone should not be used for interpretation of order of components or reasoning based on one identifier being smaller than another identifier.

The x axis, the y axis, and the z axis in the present disclosure are provided for the purpose of illustration, and may be replaced with one another. Components in the present disclosure have been described using an orthogonal coordinate system formed by the x axis, the y axis, and the z axis, but the positional relationships among components according to the present disclosure are not limited to orthogonal relationships.

REFERENCE SIGNS LIST 1, 6, 7, 8, 9, 11, 16, 17, 18, 19 imaging apparatus
2 imaging optical system
3 substrate portion
4 holding member
4a first holding surface (third surface)
4b second holding surface (fourth surface)
4c holding side surface
4d third holding surface (fifth surface)
4e projection side surface
5 bonding member
21 first lens
22 second lens
31 image sensor
32 substrate
32a first substrate surface (first surface)
32b second substrate surface (second surface)
32c substrate side surface
41 groove wall portion
42 groove
43 projection
44 overhang
51 first bonding part
52 second bonding part
53 side surface bonding part
54 first bonding member
55 second bonding member
321 through hole
322 hole wall

The invention claimed is:

1. An imaging apparatus comprising:
an imaging optical system including at least one optical element;
a holding member holding the imaging optical system;
an image sensor configured to capture a subject image formed by the imaging optical system;
a substrate having the image sensor mounted thereon on a mounting surface of the substrate; and
a bonding member fixing a substrate portion to the holding member, the substrate portion integrating the image sensor and the substrate, wherein the bonding member is partly in contact with a surface of the substrate portion,
at at least two positions in a part of the surface of the substrate portion in contact with the bonding member, the surface of the substrate portion faces different directions,
the holding member includes a first holding surface facing at least a part of a first substrate surface facing a direction opposite to the mounting surface of the substrate on a side opposite to the imaging optical system with respect to the substrate, and a third holding surface facing a facing direction of a second substrate surface on a side of the imaging optical system with respect to the substrate, the second substrate surface being the mounting surface of the substrate, and
the bonding member contacts at least part of each of the first holding surface and the third holding surface.

2. The imaging apparatus according to claim 1, wherein at the at least two positions in the part of the surface of the substrate portion in contact with the bonding member, the surface of the substrate portion faces substantially opposite directions.

3. The imaging apparatus according to claim 1, wherein the at least two positions are on different planar surfaces constituting the surface of the substrate portion.

4. The imaging apparatus according to claim 3, wherein the holding member has a plurality of planar surfaces which are in contact with the bonding member and respectively face the different planar surfaces of the substrate portion in contact with the bonding member.

5. The imaging apparatus according to claim 3, wherein the bonding member does not contact the first substrate surface and the second substrate surface.

6. The imaging apparatus according to claim 1, wherein the bonding member includes a first bonding member and a second bonding member different from the first bonding member,
the first bonding member and the second bonding member are respectively in contact with a first contact portion and a second contact portion of the surface of the substrate portion, the second contact portion being different from the first contact portion,
the first bonding member and the second bonding member are respectively in contact with a third contact portion on the first holding surface of the holding member and a fourth contact portion on the third holding surface of the holding member, the fourth contact portion being different from the third contact portion, and
a direction from the first contact portion to the third contact portion and a direction from the second contact portion to the fourth contact portion are different.

7. The imaging apparatus according to claim 6, wherein the first contact portion includes a part of the first substrate surface, and the second contact portion includes a part of the second substrate surface.

8. The imaging apparatus according to claim 7, wherein the first contact portion and the second contact portion include at least a part of a substrate side surface of the surface of the substrate portion, the substrate side surface being substantially orthogonal to the first substrate surface and the second substrate surface.

9. The imaging apparatus according to claim 7, wherein the third contact portion has a surface facing the first substrate surface, and the fourth contact portion has a surface not facing the second substrate surface.

10. The imaging apparatus according to claim 6, wherein the first bonding member and the second bonding member differ from each other in a shrinkage ratio in curing or an elastic modulus after curing.

11. The imaging apparatus according to claim 10, wherein when the first bonding member has a lower shrinkage ratio or elastic modulus than the second bonding member, a volume of the first bonding member between the first contact portion and the third contact portion is larger than a volume of the second bonding member between the second contact portion and the fourth contact portion.

12. The imaging apparatus according to claim 6, wherein the first bonding member is an ultraviolet curing type, and the second bonding member is a thermosetting type.

13. The imaging apparatus according to claim 1, wherein the bonding member includes a first bonding part in contact with the first substrate surface and the first holding surface, and a second bonding part in contact with a peripheral part of the second substrate surface and the third holding surface.

14. The imaging apparatus according to claim 1, wherein
the substrate includes a substrate side surface orthogonal to the first substrate surface and the second substrate surface,
the holding member includes a groove positioned on the first holding surface and a holding side surface opposing to the substrate side surface, and
the bonding member contacts each of at least a part of the third holding surface, the groove, the holding side surface, and the substrate side surface.

15. A mobile object comprising
an imaging apparatus including:
an imaging optical system including at least one optical element;
a holding member holding the imaging optical system;
an image sensor configured to capture a subject image formed by the imaging optical system;
a substrate having the image sensor mounted thereon on a mounting surface of the substrate; and
a bonding member fixing a substrate portion to the holding member, the substrate portion integrating the image sensor and the substrate, wherein
the bonding member is partly in contact with a surface of the substrate portion,
at at least two positions in a part of the surface of the substrate portion in contact with the bonding member, the surface of the substrate portion faces different directions,
the holding member includes a first holding surface facing at least a part of a first substrate surface facing a direction opposite to the mounting surface of the substrate on a side opposite to the imaging optical system with respect to the substrate, and a third holding surface facing a facing direction of a second substrate surface on a side of the imaging optical system with respect to the substrate, the second substrate surface being the mounting surface of the substrate, and
the bonding member contacts at least part of each of the first holding surface and the third holding surface.

16. A manufacturing method for an imaging apparatus that includes: an imaging optical system including at least one optical element; a holding member holding the imaging optical system; an image sensor configured to capture a subject image formed by the imaging optical system; a substrate having the image sensor mounted thereon on a mounting surface of the substrate; and a first bonding member and a second bonding member fixing a substrate portion to the holding member, the substrate portion integrating the image sensor and the substrate, and the second bonding member being different from the first bonding member, wherein the first bonding member and the second bonding member partially contact surfaces of the substrate portion, and the surfaces of the substrate portion contacting with the first bonding member and the second bonding member face different directions from each other, the holding member includes a first holding surface facing at least a part of a first substrate surface facing a direction opposite to the mounting surface of the substrate on a side opposite to the imaging optical system with respect to the substrate, and a third holding surface facing a facing direction of a second substrate surface on a side of the imaging optical system with respect to the substrate, the second substrate surface being the mounting surface of the substrate, the manufacturing method comprising:
applying the first bonding member to a third contact portion on the first holding surface of the holding member;
bringing a first contact portion on the first substrate surface of the substrate into contact with the first bonding member applied to the third contact portion;
curing the first bonding member;
applying the second bonding member to a second contact portion on the second substrate surface of the substrate and a fourth contact portion on the third holding surface of the holding member different from the third contact portion; and
curing the second bonding member.

* * * * *